United States Patent
Li et al.

(10) Patent No.: US 12,394,623 B2
(45) Date of Patent: Aug. 19, 2025

(54) NON-CONTIGUOUS CHANNEL BONDING

(71) Applicant: Intel Corporation, Santa Clara, CA (US)

(72) Inventors: Qinghua Li, San Ramon, CA (US); Xiaogang Chen, Portland, OR (US); Po-Kai Huang, San Jose, CA (US); Yuan Zhu, Beijing (CN); Yushu Zhang, Beijing (CN)

(73) Assignee: Intel Corporation, Santa Clara, CA (US)

( * ) Notice: Subject to any disclaimer, the term of this patent is extended or adjusted under 35 U.S.C. 154(b) by 882 days.

(21) Appl. No.: 17/513,668

(22) Filed: Oct. 28, 2021

(65) Prior Publication Data

US 2022/0053565 A1 Feb. 17, 2022

Related U.S. Application Data

(63) Continuation of application No. 16/656,967, filed on Oct. 18, 2019, now Pat. No. 11,184,927, which is a
(Continued)

(51) Int. Cl.
| | |
|---|---|
| H01L 21/02 | (2006.01) |
| C30B 11/12 | (2006.01) |
| C30B 29/60 | (2006.01) |
| C30B 29/66 | (2006.01) |
| H04L 5/00 | (2006.01) |
| H04W 24/00 | (2009.01) |
| H04W 72/02 | (2009.01) |
| H04W 74/0808 | (2024.01) |

(Continued)

(52) U.S. Cl.
CPC ........ *H01L 21/02603* (2013.01); *C30B 11/12* (2013.01); *C30B 29/60* (2013.01); *C30B 29/66* (2013.01); *H04L 5/001* (2013.01); *H04W 72/02* (2013.01); *H04W 74/0808* (2013.01); *H04W 88/08* (2013.01); *H04W 24/00* (2013.01); *H04W 74/0816* (2013.01); *H04W 84/12* (2013.01)

(58) Field of Classification Search
None
See application file for complete search history.

(56) References Cited

U.S. PATENT DOCUMENTS

| | | | | |
|---|---|---|---|---|
| 2014/0307650 A1* | 10/2014 | Vermani | ............. | H04L 27/2613 370/329 |
| 2015/0327276 A1* | 11/2015 | Rebeiz | .................. | H04W 72/52 370/329 |

(Continued)

*Primary Examiner* — Srinivasa R Reddivalam
(74) *Attorney, Agent, or Firm* — Eversheds Sutherland (US) LLP

(57) ABSTRACT

This disclosure describes methods, apparatus, and systems related to non-contiguous channel bonding. A device may determine a wireless communication channel having one or more subchannels in accordance with one or more communication standards. The device may determine instructions to perform one or more clear channel assessments (CCAs) on at least one of the one or more subchannels. The device may cause to send the instructions to one or more first devices. The device may identify a frame received from at least one of the one or more first devices, wherein the frame is received on at least one available subchannel of the one or more subchannels.

20 Claims, 14 Drawing Sheets

Related U.S. Application Data continuation of application No. 15/763,422, filed as application No. PCT/US2016/039794 on Jun. 28, 2016, now abandoned.

(60) Provisional application No. 62/244,603, filed on Oct. 21, 2015.

(51) Int. Cl.
*H04W 74/0816* (2024.01)
*H04W 84/12* (2009.01)
*H04W 88/08* (2009.01)

(56) References Cited

U.S. PATENT DOCUMENTS

| | | | |
|---|---|---|---|
| 2016/0021661 A1* | 1/2016 | Yerramalli | H04B 17/309 |
| | | | 370/329 |
| 2016/0100396 A1* | 4/2016 | Seok | H04L 5/003 |
| | | | 370/329 |
| 2016/0105836 A1* | 4/2016 | Seok | H04W 72/23 |
| | | | 370/331 |
| 2016/0212246 A1* | 7/2016 | Seok | H04L 69/323 |

* cited by examiner

NON-CONTIGUOUS CHANNEL BONDING

CROSS-REFERENCE TO RELATED APPLICATIONS

This application is a continuation of U.S. application Ser. No. 16/656,967, filed Oct. 18, 2019, which is a continuation of U.S. application Ser. No. 15/763,422, filed Mar. 26, 2018, now U.S. Pat. No. 10,669,647, issued May 13, 2020, which claims the priority benefit of International Application No. PCT/US2016/039794, filed Jun. 28, 2016, which claims the benefit of U.S. Provisional Application No. 62/244,603 filed Oct. 21, 2015, the disclosures of which is incorporated herein by reference as if set forth in full.

TECHNICAL FIELD

This disclosure generally relates to systems and methods for wireless communications and, more particularly, to non-contiguous channel bonding in wireless communications.

BACKGROUND

Wireless devices are becoming widely prevalent and are increasingly requesting access to wireless channels. A next generation WLAN, IEEE 802.11ax or High-Efficiency WLAN (HEW) utilizes Orthogonal Frequency-Division Multiple Access (OFDMA) in channel allocation. Communication channels may be comprised of one or more sub-channels, where individual subchannels may be susceptible to interference from adjacent devices.

DETAILED DESCRIPTION

Figure 1A:
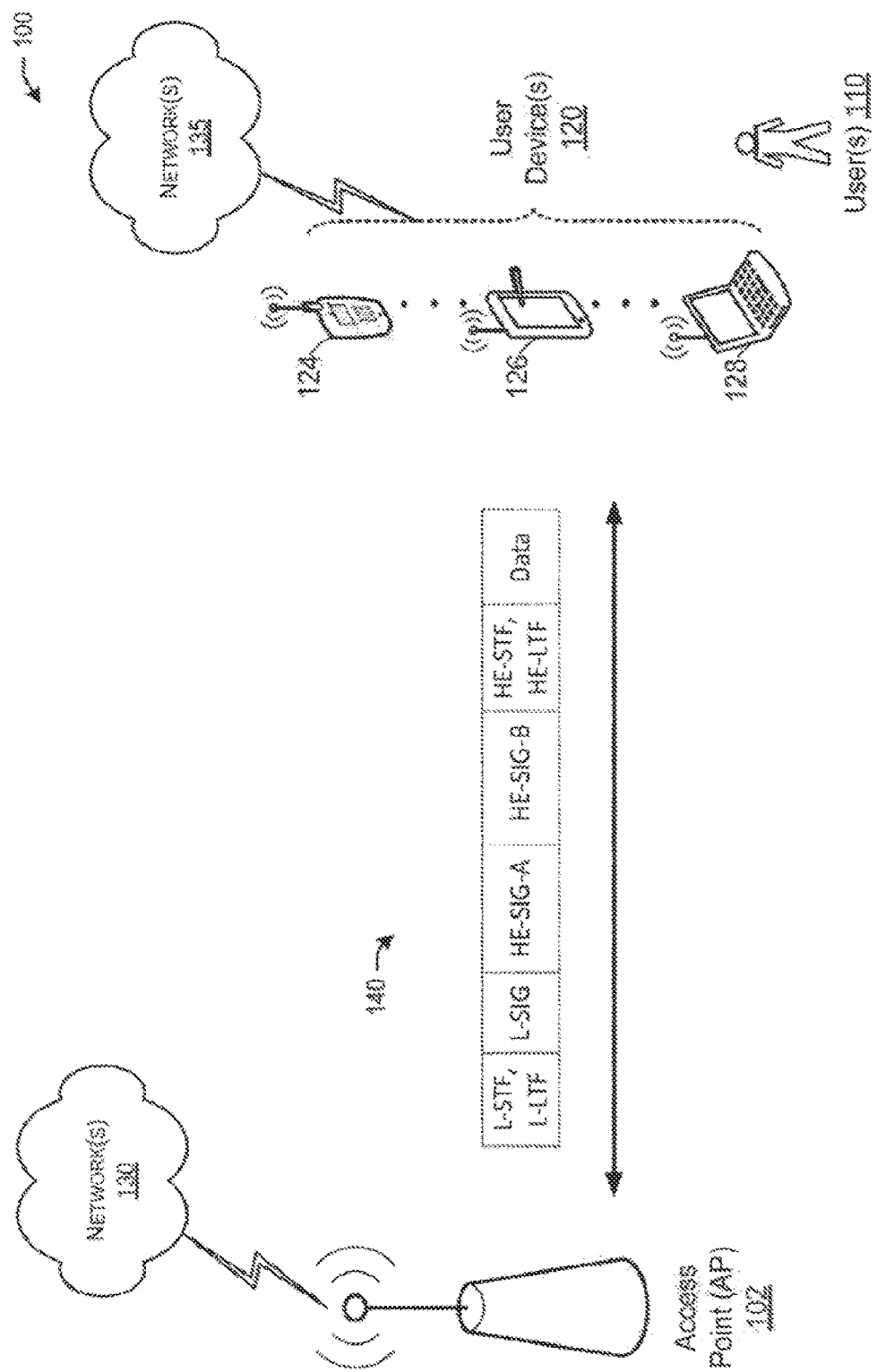
FIG. 1A depicts a network diagram illustrating an example network environment of an illustrative non-contiguous channel bonding system, according to one or more example embodiments of the disclosure.

Example embodiments described herein provide certain systems, methods, and devices, for providing signaling to Wi-Fi devices in various Wi-Fi networks, including, but not limited to, IEEE 802.11ax (referred to as HE or HEW).

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

During communication between two devices, one or more frames may be sent and received. These frames may include one or more fields (or symbols) that may be based on an IEEE 802.11 standard. In a high efficiency communication (e.g., HEW) these one or more fields may be represented by one or more OFDMA symbols.

In the case where the legacy device and the HEW device coexist, the legacy device may support and may use a 20 MHz band to communicate with the AP or another legacy device in peer to peer mode. Since HEW may support 80 MHz, one of the 20 MHz subchannels of the 80 MHz band may be used by the legacy device causing a puncturing of the 80 MHz. That is, the HEW device may have to use the unused subchannels. However, non-contiguous channel bonding may not be supported, and therefore, the HEW device may only use the primary subchannel.

A Fast Fourier Transform (FFT) circuit may be used to separate the signals between subchannels. In order to do so, the FFT circuitry may have to be powered on. However, the FFT circuitry may utilize additional power while it is powered on. In order for a device to measure its Clear Channel assessment (CCA), the device should have the FFT circuitry powered on or the device may use low pass filtering for the CCA measurement. Both of these mechanisms utilize additional power and therefore excessive use of CCA measurement may result in increased power consumption.

CCA measurement may be utilized by a device in order to determine whether the channel is clear based on a decibel-milliwatts (dBm) level of reception. The FFT circuit may not be always turned on in order to save power. When it is off, the power measurement for each 20 MHz subchannel may need to be done in time domain samples in order to save power. For example, the receiving device may need to down-convert each 20 MHz subchannel to baseband around direct current (DC) and conduct low pass filtering. This consumes digital multiplications and power. Besides FFT, there are other alternatives for separating the signals of different subchannels so that CCA for the subchannels can be conducted. Band pass filtering is one of the alternatives and it also consumes power as FFT does.

Example embodiments of the present disclosure relate to systems, methods, and devices for non-contiguous channel bonding that facilitates a trigger based and a non-trigger based non-contiguous channel bonding. In the trigger-based case, a device may be instructed to conduct CCA within a limited time. For example, a trigger frame may instruct the device to measure the CCA for each 20 MHz subchannel after the trigger frame, within, for example, a few microseconds (e.g., 4 microseconds). Since FFT should be used for a limited time in order to preserve power consumption, CCA measurement may be performed for each 20 MHz subchannel. In the non-trigger based case, the device may monitor the channel without instructions, in order to determine whether the channel is available or not.

In one embodiment, if the communication between devices (e.g., between an AP and a user device) is configured to operate on a 160 MHz channel, a device may be instructed to measure the CCA of the primary 20 MHz, the secondary 20 MHz, the secondary 40 MHz, and the secondary 80 MHz. This may allow a limited number of CCA measurements resulting in lower power consumption as opposed to having to measure the CCA for each of the subchannels in the 160 MHz channel.

In one embodiment, if the communication between devices is configured to operate in an 80 MHz channel, a device may be instructed to measure the CCA of the primary 20 MHz, the secondary 20 MHz, and the secondary 40 MHz.

In one embodiment, a device may be instructed to perform one or more CCA measurements in addition to the above measurements. For example, if only one additional CCA measurement is supported, a device may measure the CCA of half of the largest secondary subchannel. For example, if the maximum bandwidth of the system is 80 MHz, then the largest secondary subchannel is the secondary 40 MHz subchannel. This results in 4 CCA measurements in the 80 MHz channel. The extra CCA measurement may determine which, if any, of the individual 20 MHz subchannels in the secondary 40 MHz subchannel are busy or available. This essentially allows the device to perform CCA measurements for each of the 20 MHz subchannels in the 80 MHz channel. For example, in FIG. 3A, the occupancy on the secondary 20 MHz can be detected. For another example, the joint occupancies on both the secondary 20 MHz and the lower (or second) 20 MHz of the secondary 40 MHz can be detected as well.

In one embodiment, if the communication between devices is configured to operate in a 160 MHz channel, one additional CCA measurement may requested for the largest secondary channel (e.g., the secondary 80 MHz subchannel). That is, two CCA measurements will be performed by the device, one for the first 40 MHz in the secondary 80 MHz subchannel and another one for the second 40 MHz in the secondary 80 MHz subchannel.

The above descriptions are for purposes of illustration and are not meant to be limiting. Numerous other examples, configurations, processes, etc., may exist, some of which are described in detail below. Example embodiments will now be described with reference to the accompanying figures.

FIG. 1A is a network diagram illustrating an example network environment, according to some example embodiments of the present disclosure. Wireless network 100 may include one or more devices 120 and one or more access point(s) (AP) 102, which may communicate in accordance with IEEE 802.11 communication standards, including IEEE 802.11ax. The device(s) 120 may be mobile devices that are non-stationary and do not have fixed locations.

Figure 7:
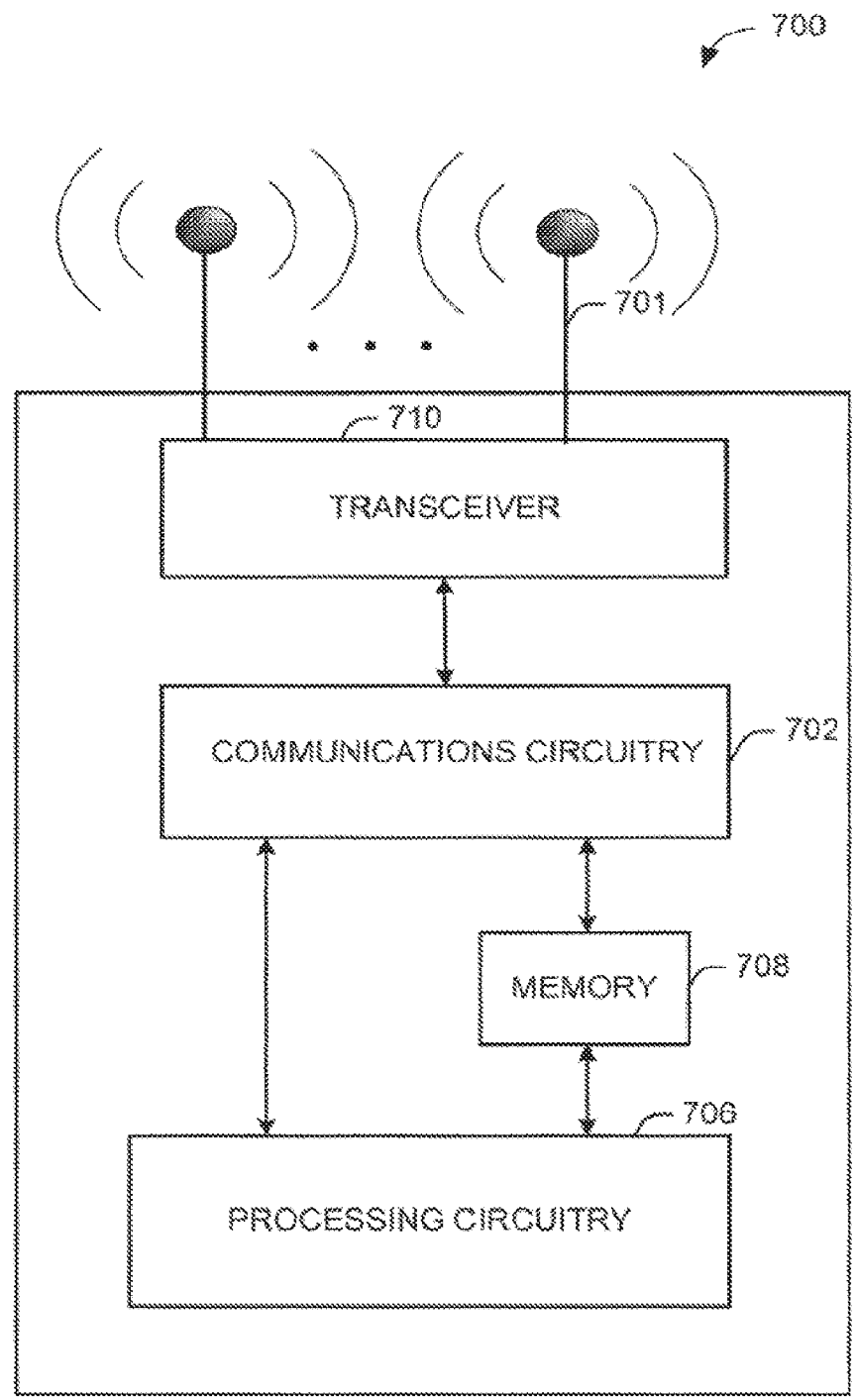
FIG. 7 illustrates a functional diagram of an example communication station that may be suitable for use as a user device, in accordance with one or more example embodiments of the present disclosure.
Figure 8:
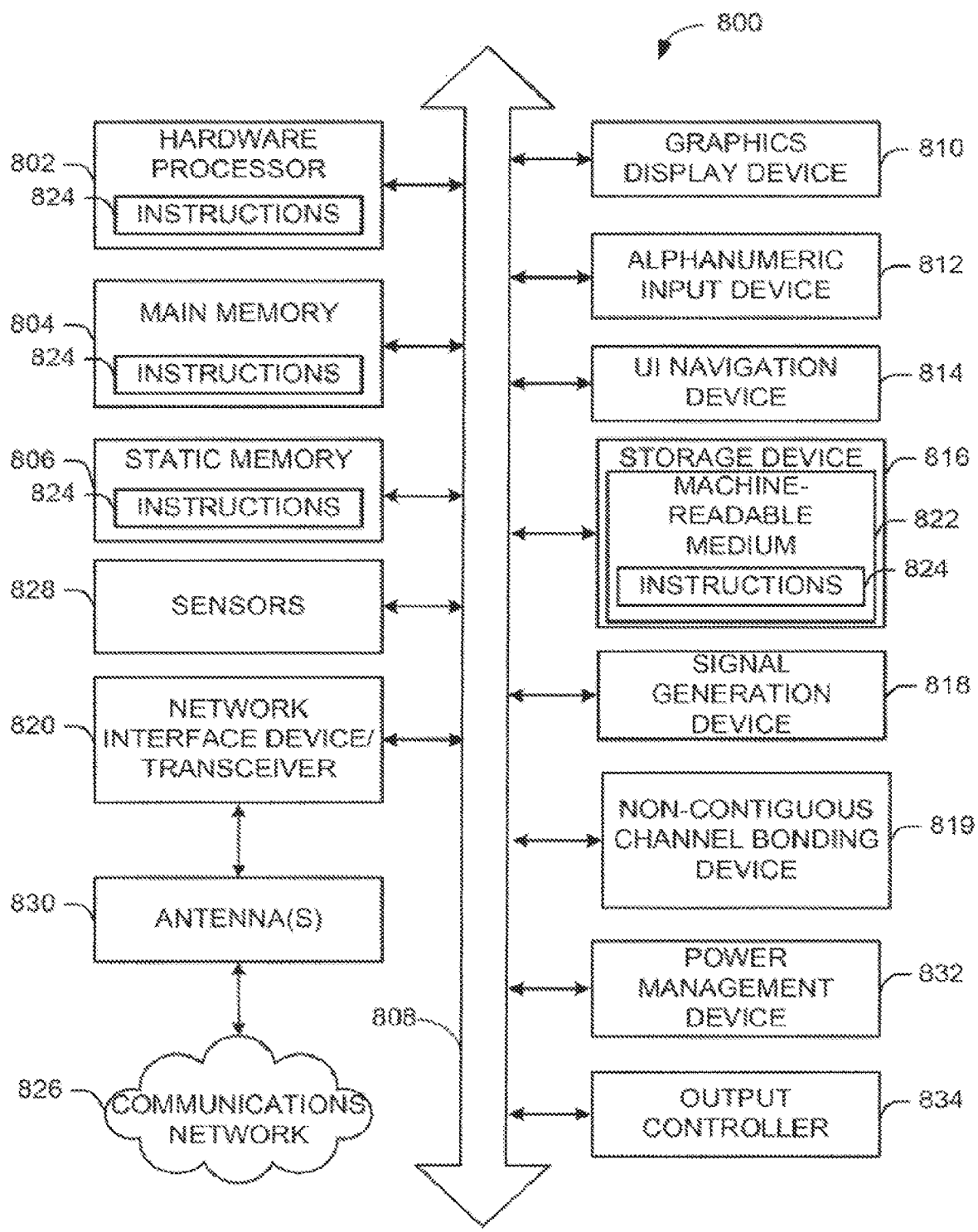
FIG. 8 is a block diagram of an example machine upon which any of one or more techniques (e.g., methods) may be performed, in accordance with one or more example embodiments of the present disclosure.

In some embodiments, the user devices 120 and AP 102 may include one or more computer systems similar to that of the functional diagram of FIG. 7 and/or the example machine/system of FIG. 8.

One or more illustrative user device(s) 120 and/or AP 102 may be operable by one or more user(s) 110. The user device(s) 120 (e.g., 124, 126, or 128) and/or AP 102 may include any suitable processor-driven device including, but not limited to, a mobile device or a non-mobile, e.g., a static, device. For example, user device(s) 120 and/or AP 102 may include, a user equipment (UE), a station (STA), an access point (AP), a personal computer (PC), a wearable wireless device (e.g., bracelet, watch, glasses, ring, etc.), a desktop computer, a mobile computer, a laptop computer, an Ultrabook™ computer, a notebook computer, a tablet computer, a server computer, a handheld computer, a handheld device, an internet of things (IoT) device, a sensor device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "carry small live large" (CSLL) device, an ultra mobile device (UMD), an ultra mobile PC (UMPC), a mobile internet device (MID), an "origami" device or computing device, a device that supports dynamically composable computing (DCC), a context-aware device, a video device, an audio device, an A/V device, a set-top-box (STB), a blu-ray disc (BD) player, a BD recorder, a digital video disc (DVD) player, a high definition (HD) DVD player, a DVD recorder, a HD DVD recorder, a personal video recorder (PVR), a broadcast HD receiver, a video source, an audio source, a video sink, an audio sink, a stereo tuner, a broadcast radio receiver, a flat panel display, a personal media player (PMP), a digital video camera (DVC), a digital audio player, a speaker, an audio receiver, an audio amplifier, a gaming device, a data source, a data sink, a digital still camera (DSC), a media player, a smartphone, a television, a music player, or the like. It is understood that the above is a list of devices. However, other devices, including smart devices such as lamps, climate control, car components, household components, appliances, etc. may also be included in this list.

Any of the user device(s) 120 (e.g., user devices 124, 126, 128), and AP 102 may be configured to communicate with each other via one or more communications networks 130 and/or 135 wirelessly or wired. Any of the communications networks 130 and/or 135 may include, but not limited to, any one of a combination of different types of suitable communications networks such as, for example, broadcasting networks, cable networks, public networks (e.g., the Internet), private networks, wireless networks, cellular networks, or any other suitable private and/or public networks. Further, any of the communications networks 130 and/or 135 may have any suitable communication range associated therewith and may include, for example, global networks (e.g., the Internet), metropolitan area networks (MANs), wide area networks (WANs), local area networks (LANs), or personal area networks (PANs). In addition, any of the communications networks 130 and/or 135 may include any type of medium over which network traffic may be carried including, but not limited to, coaxial cable, twisted-pair wire, optical fiber, a hybrid fiber coaxial (HFC) medium, microwave terrestrial transceivers, radio frequency communication mediums, white space communication mediums, ultra-high frequency communication mediums, satellite communication mediums, or any combination thereof.

Any of the user device(s) 120 (e.g., user devices 124, 126, 128), and AP 102 may include one or more communications antennas. The one or more communications antennas may be any suitable type of antennas corresponding to the communications protocols used by the user device(s) 120 (e.g., user devices 124, 126 and 128), and AP 102. Some non-limiting examples of suitable communications antennas include Wi-Fi antennas, Institute of Electrical and Electronics Engineers (IEEE) 802.11 family of standards compatible antennas, directional antennas, non-directional antennas, dipole antennas, folded dipole antennas, patch antennas, multiple-input multiple-output (MIMO) antennas, omnidirectional antennas, quasi-omnidirectional antennas, or the like. The one or more communications antennas may be communicatively coupled to a radio component to transmit and/or receive signals, such as communications signals to and/or from the user devices 120 and/or AP 102.

Any of the user device(s) 120 (e.g., user devices 124, 126, 128), and AP 102 may be configured to perform directional transmission and/or directional reception in conjunction with wirelessly communicating in a wireless network. Any of the user device(s) 120 (e.g., user devices 124, 126, 128), and AP 102 may be configured to perform such directional transmission and/or reception using a set of multiple antenna arrays (e.g., DMG antenna arrays or the like). Each of the multiple antenna arrays may be used for transmission and/or reception in a particular respective direction or range of directions. Any of the user device(s) 120 (e.g., user devices 124, 126, 128), and AP 102 may be configured to perform any given directional transmission towards one or more defined transmit sectors. Any of the user device(s) 120 (e.g., user devices 124, 126, 128), and AP 102 may be configured to perform any given directional reception from one or more defined receive sectors.

MIMO beamforming in a wireless network may be accomplished using RF beamforming and/or digital beamforming. In some embodiments, in performing a given MIMO transmission, user devices 120 and/or AP 102 may be configured to use all or a subset of its one or more communications antennas to perform MIMO beamforming.

Any of the user devices 120 (e.g., user devices 124, 126, 128), and AP 102 may include any suitable radio and/or transceiver for transmitting and/or receiving radio frequency (RF) signals in the bandwidth and/or channels corresponding to the communications protocols utilized by any of the user device(s) 120 and AP 102 to communicate with each other. The radio components may include hardware and/or software to modulate and/or demodulate communications signals according to pre-established transmission protocols. The radio components may further have hardware and/or software instructions to communicate via one or more Wi-Fi and/or Wi-Fi direct protocols, as standardized by the Institute of Electrical and Electronics Engineers (IEEE) 802.11 standards. In certain example embodiments, the radio component, in cooperation with the communications antennas, may be configured to communicate via 2.4 GHz channels (e.g. 802.11b, 802.11g, 802.11n, 802.11ax), 5 GHz channels (e.g. 802.11n, 802.11ac, 802.11ax), or 60 GHZ channels (e.g. 802.11ad). In some embodiments, non-Wi-Fi protocols may be used for communications between devices, such as Bluetooth, dedicated short-range communication (DSRC), Ultra-High Frequency (UHF) (e.g. IEEE 802.11af, IEEE 802.22), white band frequency (e.g., white spaces), or other packetized radio communications. The radio component may include any known receiver and baseband suitable for communicating via the communications protocols. The radio component may further include a low noise amplifier (LNA), additional signal amplifiers, an analog-to-digital (A/D) converter, one or more buffers, and digital baseband.

Typically, when an AP (e.g., AP 102) establishes communication with one or more user devices 120 (e.g., user devices 124, 126, and/or 128), the AP may communicate in the downlink direction by sending data frames. The data frames may be preceded by one or more preambles that may be part of one or more headers. These preambles may be used to allow the user device to detect a new incoming data frame from the AP. A preamble may be a signal used in network communications to synchronize transmission timing between two or more devices (e.g., between the APs and user devices). The communication may include communication between legacy devices and/or HEW devices.

In one embodiment, and with reference to FIG. 1A, an HEW preamble (e.g., preamble 140) may include one or more fields, such as, legacy short training and long training field, a legacy signal field (L-SIG), a high efficiency signal A (HE-SIG-A) field, a high efficiency signal B (HE-SIG-B) field, high efficiency short training and long training fields.

These fields may be communicated between the devices such as the AP 102 and one or more user devices 120. The communication may utilize a certain frequency band (e.g., 20, 40, 80, 160 MHz, etc.) based on the device and the IEEE standard followed by the device (e.g., legacy devices or HEW device). For example, legacy devices may utilize a 20 MHz but HEW device may support the same 20 MHz band and larger frequency bands. It is understood that the above acronyms may be different and not to be construed as a limitation as other acronyms maybe used for the fields included in an HEW preamble.

Figure 1B:
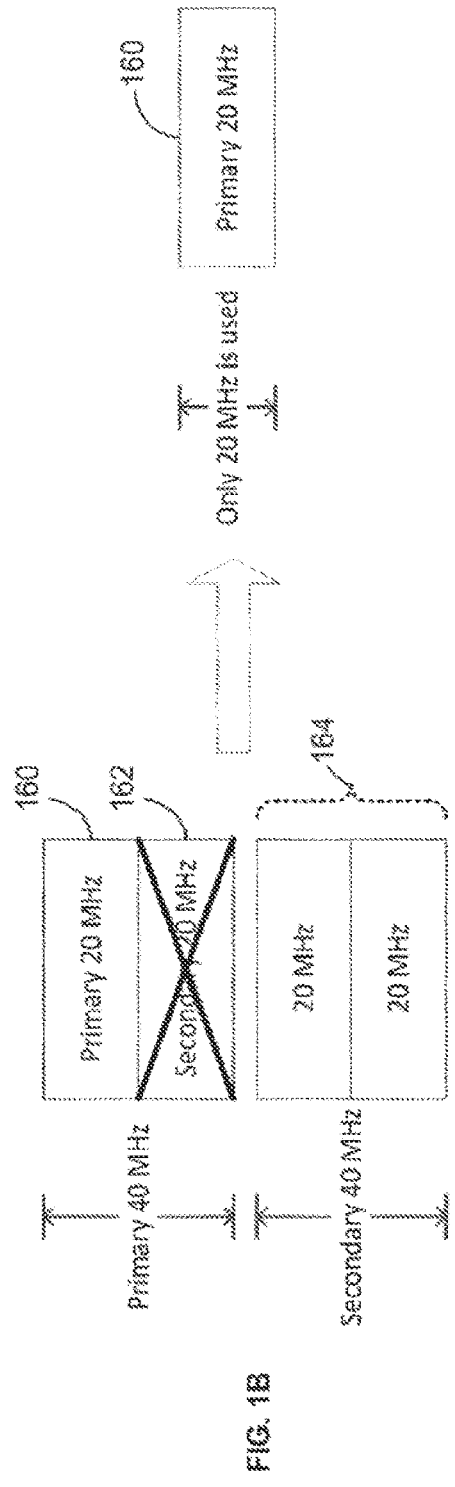
FIG. 1B depict depicts a diagram illustrating throughput degradation in contiguous channel bonding.

FIG. 1B depicts a diagram illustrating throughput degradation in contiguous channel bonding. A contiguous channel is a channel that contains one or more subchannels that are adjacent to each other. In other words, may be following each other in frequency. A contiguous channel may include at least in part a contiguous 20 MHz channel, contiguous 40 MHz channel, contiguous 80 MHz channel and/or contiguous 160 MHz channel.

In the example of FIG. 1B, devices may utilize an 80 MHz channel for communication. The 80 MHz channel may include a primary 40 MHz and a secondary 40 MHz subchannel 164. The primary 40 MHz may also be comprised of a primary 20 MHz subchannel 160 and a secondary 20 MHz subchannel 162. In some scenarios, the secondary 20 MHz subchannel 162 may become busy or unavailable, but the rest of the other subchannels (e.g., the primary 20 MHz subchannel 160, and the secondary 40 MHz subchannel 164) may be idle or available. In the case of contiguous channel bonding, a device may only be able to use the primary 20 MHz subchannel 160 since the rest of the subchannels are not contiguous with the primary 20 MHz subchannel 160. Therefore, only 20 MHz instead of the 60 MHz that is still available may be used for the communication, resulting in unused subchannels. It should be noted that the primary 20 MHz subchannel could be at any of the 20 MHz subchannel within the 40 MHz, 80 MHz, and 160 MHz bands, respectively. The primary 20 MHz is shown as the first 20 MHz subchannel in the figures only for an illustration purpose.

Figure 1C:
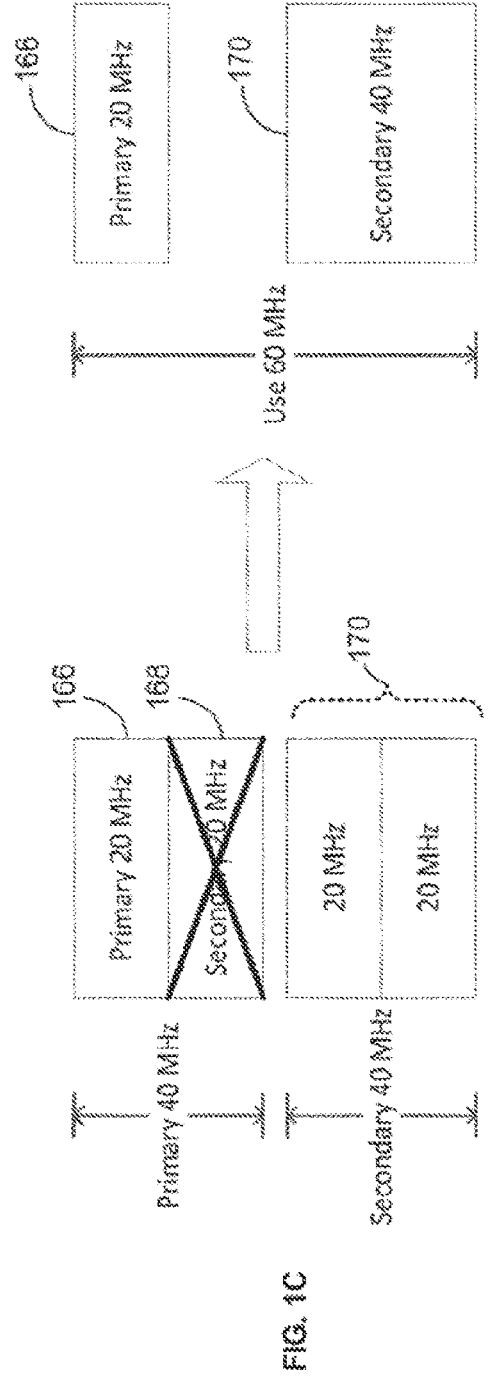
FIG. 1C depicts an illustrative schematic diagram of a non-contiguous channel bonding, according to one or more example embodiments of the disclosure.

FIG. 1C depicts an illustrative schematic diagram of a non-contiguous channel bonding, according to one or more example embodiments of the disclosure. A non-contiguous channel is a channel that contains sub channels that are separated by one or more frequency gaps.

In FIG. 1C, an 80 MHz channel may, similarly to FIG. 1B, contain one or more subchannels and may have one of these subchannels busy or unavailable.

In one embodiment, a non-contiguous channel bonding system may determine a busy or unavailable subchannel and may allow for non-contiguous channels to be utilized by a device even though one of the allocated subchannels is busy or unavailable. For example, devices may utilize an 80 MHz channel for communication. The 80 MHz channel may be comprised of a primary 40 MHz subchannel that may include a primary 20 MHz subchannel 166 and a secondary 20 MHz subchannel on 68. The 80 MHz channel may also include a secondary 40 MHz subchannel 170. In the example of FIG. 1C, secondary 20 MHz subchannel 168 may be unavailable or busy. In one embodiment, a device may be able to utilize primary 20 MHz subchannel 166 and/or secondary 40 MHz subchannel 170 in order to communicate with another device. Therefore, 60 MHz may be available to be used for communication, as opposed to only 20 MHz subchannel in the contiguous channel bonding of FIG. 1B.

In one embodiment, the non-trigger based case, the number of CCA measurements may be kept the same as in the legacy IEEE 802.11ac, for example, perform CCA measurements only on primary 20 MHz subchannel, secondary 20, and secondary 40 in case of an 80 MHz channel. Further, in the case of a 160 MHz channel, a device may perform CCA measurements on the primary 20 MHz subchannel, the secondary 20 MHz subchannel, the secondary 40 MHz subchannel and the secondary 80 MHz subchannel. If a secondary subchannel is busy, that subchannel may not be used but the remaining usable subchannels may still be used.

Figure 2:
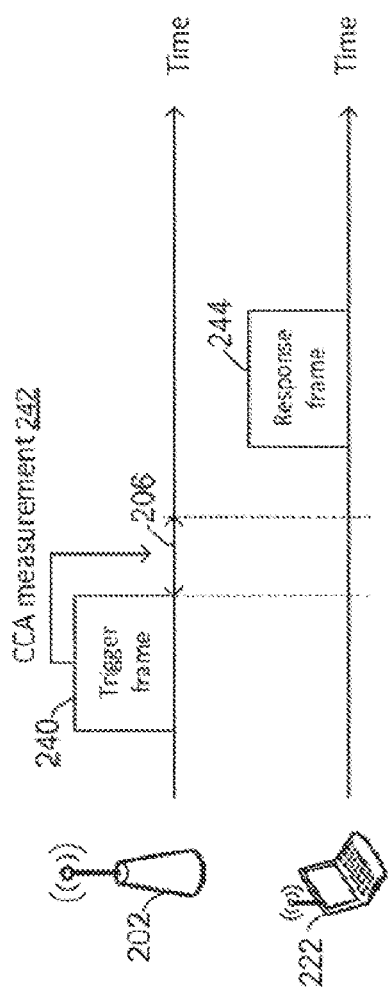
FIG. 2 depicts an illustrative schematic diagram of a trigger frame based communication, in accordance with one or more example embodiments of the present disclosure.

FIG. 2 depicts an illustrative schematic diagram of a trigger frame based communication, in accordance with one or more example embodiments of the present disclosure.

In one embodiment, if the CCA measurement is performed for a short duration, then it may be performed on each 20 MHz subchannel without spending too much power. FFT may be used to separate the signals on each 20 MHz subchannel. However, if the device monitors the channel for long time, FFT circuitry may be turned off and time domain samples may be used instead of FFT for CCA measurements. In this case, the number of CCA measurements may be limited.

In one embodiment, two cases of CCA operations may be defined: trigger based and non-trigger based. In the trigger-based case, a user device 222 may receive a trigger frame (e.g., trigger frame 240) from an AP 202. After receiving the trigger frame 240, the user device 222 may conduct CCA measurements within a predetermined time in accordance with and IEEE 802.11 standard. For example, receiving the trigger frame 240 may indicate to the user device 222 that CCA measurements may be performed. In another embodiment, the trigger frame 240 may contain information that may be decoded by the user device 222 receiving the trigger frame 240 to determine how many CCA measurements to be performed. The information may indicate to the user device 222 that CCA measurement 242 should be performed, for example, for each 20 MHz subchannel after receiving the trigger frame 240 for the predetermined time 206 (e.g., 4 microseconds). The trigger frame 240 may be a multiuser, multicast trigger a single user, or unicast frame such as request to send (RTS) frame. Since FFT is only used for a limited duration in order to conserve power, CCA measurement may be done for each 20 MHz subchannel. In the example of FIG. 2, user device 222 may need to continue the FFT operation for one symbol after the trigger frame 240. Depending on the CCA results, the response frame 244 may not be sent over the primary subchannel. For example, if the primary subchannel is busy but secondary 20 MHz and another 20 MHz subchannel are clear, the response may be sent over the available subchannels. In the non-trigger based case, the user device 222 may monitor the channel without instructions from, for example, a trigger frame. In order to reduce power consumption, FFT and CCA measurements may be used only in specific situations.

In one embodiment, a non-contiguous channel bonding system may maximize subchannel usage by performing CCA measurement at least in part on the lower subchannels in a communication channel. Referring back to FIG. 1B, it should be noted that the lower the secondary subchannel is busy (e.g., secondary 20 MHz subchannel 162), the smaller the bandwidth may be used (e.g., only 20 MHz can be used in this case). That is, the busy secondary 20 MHz subchannel 162 reduces the usable channel to 20 MHz (e.g., primary 20 MHz subchannel 160). In the same sense, if the secondary 40 MHz subchannel 164 was busy, the available subchannel may be reduced to the primary 40 MHz subchannel. Therefore, addressing the busy secondary 20 MHz subchannel in each communication channel (e.g., 20, 40, 80, 160 MHz, etc.) provides the most gain. Similarly, addressing the busy secondary 40 MHz subchannel in 160 MHz channel also provides significant gain. When FFT circuit is turned on, per 20 MHz CCA is feasible. However, in idle mode before receiving the indication for CCA measurement (e.g., using a trigger frame), the user device 222 may turn the FFT circuit off in order to save power. In this case, the CCA is usually done on time domain samples by down conversion and low pass filtering. Since these operations consume power, the number of CCA measurements may be limited. Supporting only the non-contiguous channel bonding modes that provide the most gain also may help a receiving device (e.g., user device 222) in decoding the HE preamble because this limits the formats of HE-SIG-B. The HE preamble may be sent over the primary subchannel and over other available subchannels based on the CCA measurements.

Figure 3A:
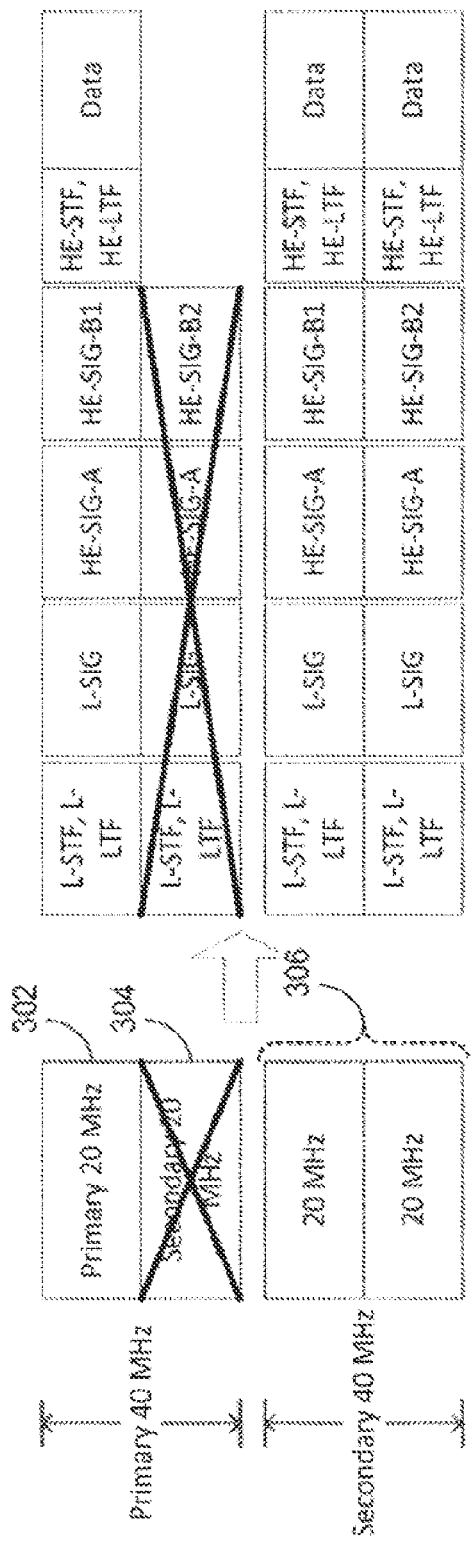
FIGS. 3A-3B depict illustrative schematic diagrams of non-contiguous channel bonding, in accordance with one or more example embodiments of the present disclosure.
Figure 3B:
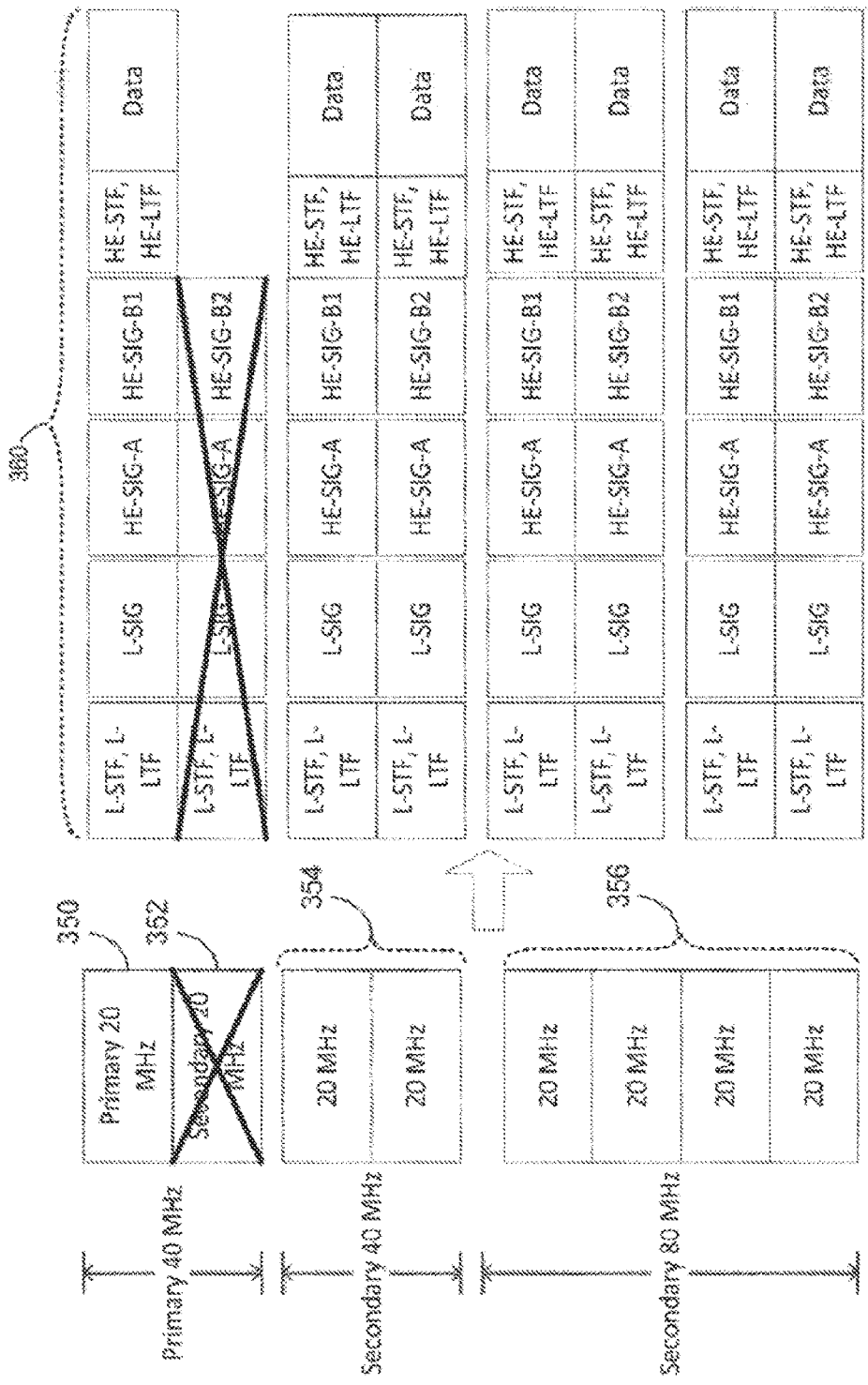

FIGS. 3A-3B depict illustrative schematic diagrams of non-contiguous channel bonding, in accordance with one or more example embodiments of the present disclosure.

In one embodiment, the CCA complexity may be kept as low as possible. For example, the CCA may be kept the same as in the legacy IEEE 802.11 standard. For example, if the system is configured to be operating on a 80 MHz channel (as in FIG. 3A), the CCA measurement may be performed on the primary 20 MHz subchannel 302, the secondary 20 MHz subchannel 304, and the secondary 40 MHz subchannel 306. If the system is configured to be operating on a 160 MHz channel (as in FIG. 3B), the CCA measurement may be performed on primary 20 MHz, secondary 20 MHz, secondary 40 MHz, and secondary 80 MHz.

In one embodiment, the non-contiguous channel bonding may be performed among the primary and the secondary subchannels. That is, the frame 360 may be sent over the available subchannels. The frame 360 may include at least in part, a legacy preamble (e.g., L-STF, L-LTF, and L-SIG), a high-efficiency preamble (HE-SIG-A and HE-SIG-B), training fields (e.g., HE-STF HE-LTF) and data. On the occupied secondary subchannel (e.g., secondary 20 MHz subchannel 352), the legacy preamble and the high efficiency preamble may not be sent.

In one embodiment, the HE-SIG-B field may be divided into two subfields HE-SIG-B1 and HE-SIG-B2 and the two may be sent over adjacent 20 MHz subchannels. For a low end user device that does not combine subfields (e.g., HE-SIG-B1 and HE-SIG-B2), the user device may only be able to decode the primary 40 MHz subchannel or the secondary 40 MHz or half of the secondary 80 MHz to get both HE-SIG-B1 and HE-SIG-B2. That is, the user device may only be able to decode the subfields in a contiguous subchannel such that any unavailable 20 MHz subchannel may render the entire 40 MHz subchannel unavailable.

Figure 4A:
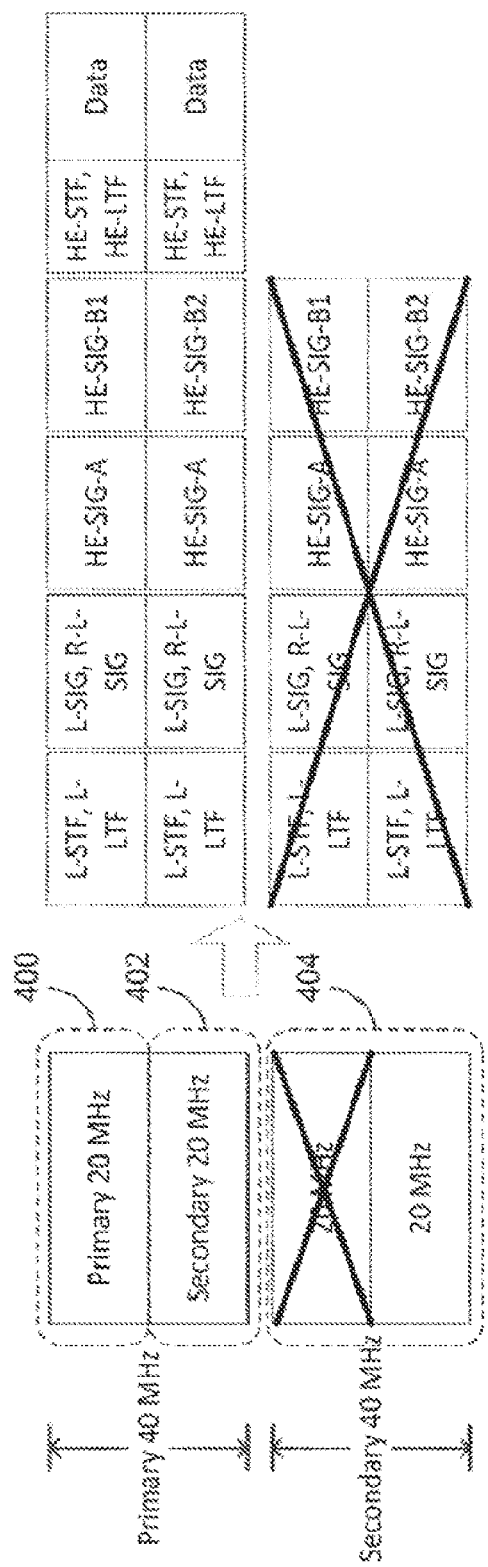
FIGS. 4A-4B depict illustrative schematic diagrams of non-contiguous channel bonding using an additional CCA measurement, in accordance with one or more example embodiments of the present disclosure.
Figure 4B:
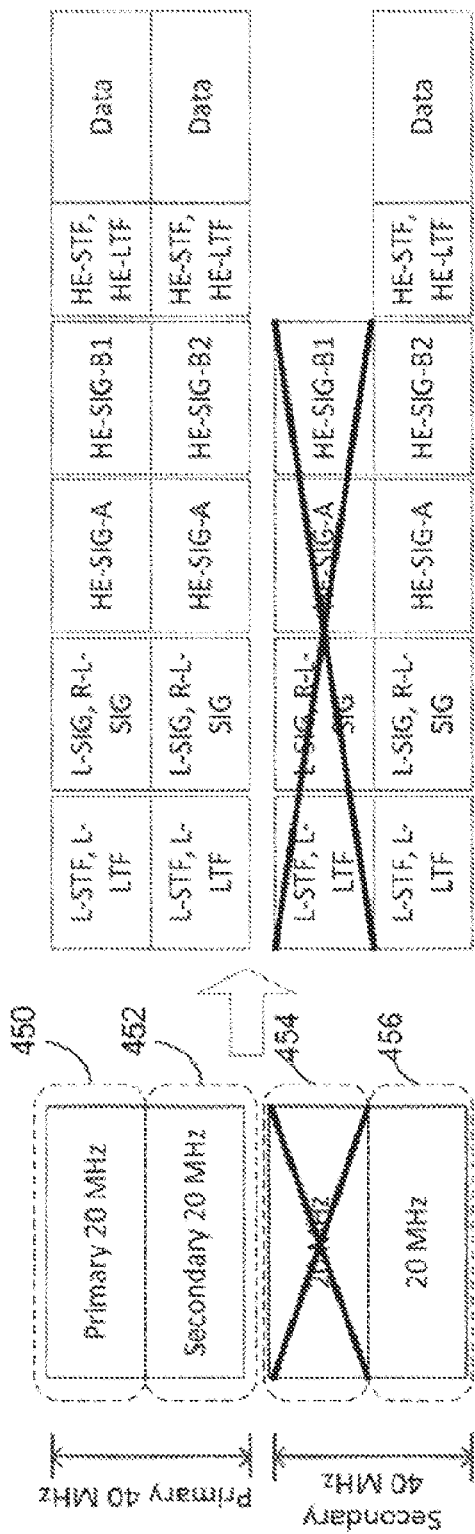

FIGS. 4A-4B depict illustrative schematic diagrams of non-contiguous channel bonding using an additional CCA measurement, in accordance with one or more example embodiments of the present disclosure.

Referring to FIG. 4A, there is shown an 80 MHz channel that is comprised of a primary 20 MHz subchannel 400, a secondary 20 MHz subchannel 402, and a secondary 40 MHz subchannel 404 (comprised of two 20 MHz subchannels). The legacy CCA operations shown in FIG. 4A, where CCA measurements are applied on the primary 20 MHz subchannel 400, the secondary 20 MHz subchannel 402 and the secondary 40 MHz subchannel 404. In this example, the secondary 20 MHz subchannel of the secondary 40 MHz subchannel 404 is occupied or unavailable, as shown by the crossed off subchannel. In the legacy systems, the lower 20 MHz subchannel of the secondary 40 MHz subchannel 404 may be unusable due to the contiguous requirement in the legacy systems. Therefore, the legacy and high efficiency preambles may not be sent over the entire secondary 40 MHz subchannel 404 as shown by the crossed off preambles in FIG. 4A.

Referring to FIG. 4B, there is shown an 80 MHz channel that is comprised of a primary 20 MHz subchannel 450, a secondary 20 MHz subchannel 452, and a secondary 40 MHz subchannel. The secondary 40 MHz subchannel may be comprised of a first secondary 20 MHz subchannel 454 and a second secondary 20 MHz subchannel 456.

In one embodiment, a non-contiguous channel bonding system may increase throughput gain by utilizing one or more additional CCA measurements on additional subchannels. As depicted in FIG. 4A, the CCA measurements are applied on the primary 20 MHz subchannel 400, the secondary 20 MHz subchannel 402 and the secondary for 40 MHz subchannel 404. The additional CCA measurement may provide CCA results for each of the 20 MHz subchannels within the secondary 40 MHz subchannel. When either of the 20 MHz subchannels within the secondary 40 MHz subchannel is occupied, the remaining usable 20 MHz subchannel can still be used. For example, in FIG. 4A, the additional CCA may salvage the second secondary 20 MHz subchannel 456 to be used to transmit the legacy and the high efficiency preambles and high efficiency data symbols.

It should be understood that although FIG. 4B depicts a busy or unavailable secondary 20 MHz channel 454 of the secondary 40 MHz subchannel, the non-contiguous channel bonding system may also utilize available subchannels when, for example, any other one or more subchannels of the 80 MHz channel are busy or unavailable. That is, the non-contiguous channel bonding system may utilize the primary 20 MHz subchannel 450, and the 20 MHz subchannel 456, when the secondary 20 MHz subchannel 452 and the secondary 20 MHz subchannel 454 are busy or unavailable. It should be understood that the primary 20 MHz subchannel may be any of the subchannels in a frequency channel (e.g., 40/80/160 MHz, etc.).

In one embodiment, the non-contiguous channel bonding system may apply an additional CCA measurement to half of the largest secondary subchannel. For example, if the maximum bandwidth of the system is 80 MHz, then the largest secondary subchannel is the secondary 40 MHz subchannel. The AP may indicate to a user device by including information associated with CCA measurements and/or non-contiguous channel bonding in a trigger frame in the trigger based case. The user device may receive the trigger frame and may perform, at least in part, the additional CCA measurement. Although this may increase power consumption due to using FFT circuitry or using time domain samples by conducting low pass filtering, throughput may be increased by performing the additional CCA measurement.

In one embodiment, after adding one CCA measurement, the user device may essentially perform CCA for each 20 MHz subchannel in the 80 MHz channel. In legacy system, if one 20 MHz in the secondary 40 MHz subchannel is occupied, the whole 40 MHz subchannel is not used as shown in FIG. 4A. In contrast, the embodiments depicted in FIG. 4B may use all remaining 20 MHz subchannels due to utilizing the additional CCA measurement. In addition, the implementation of this scheme is compatible with the legacy systems. The existing CCA operations for the secondary 40 MHz subchannel may be reused. One CCA for one of the two 20 MHz subchannels in the secondary 40 MHz subchannel is added. The CCA power measurement for the other 20 MHz subchannel may be simply obtained as $P_{CCA}(2^{nd}\ 20\ \text{MHz}) = P_{CCA}(40\ \text{MHz}) - P_{CCA}(1^{st}\ 20\ \text{MHz})$. Namely, the total power of each 20 MHz subchannel is the power of the 40 MHz secondary channel. It is understood that the above descriptions are for purposes of illustration and are not meant to be limiting.

Figure 5A:
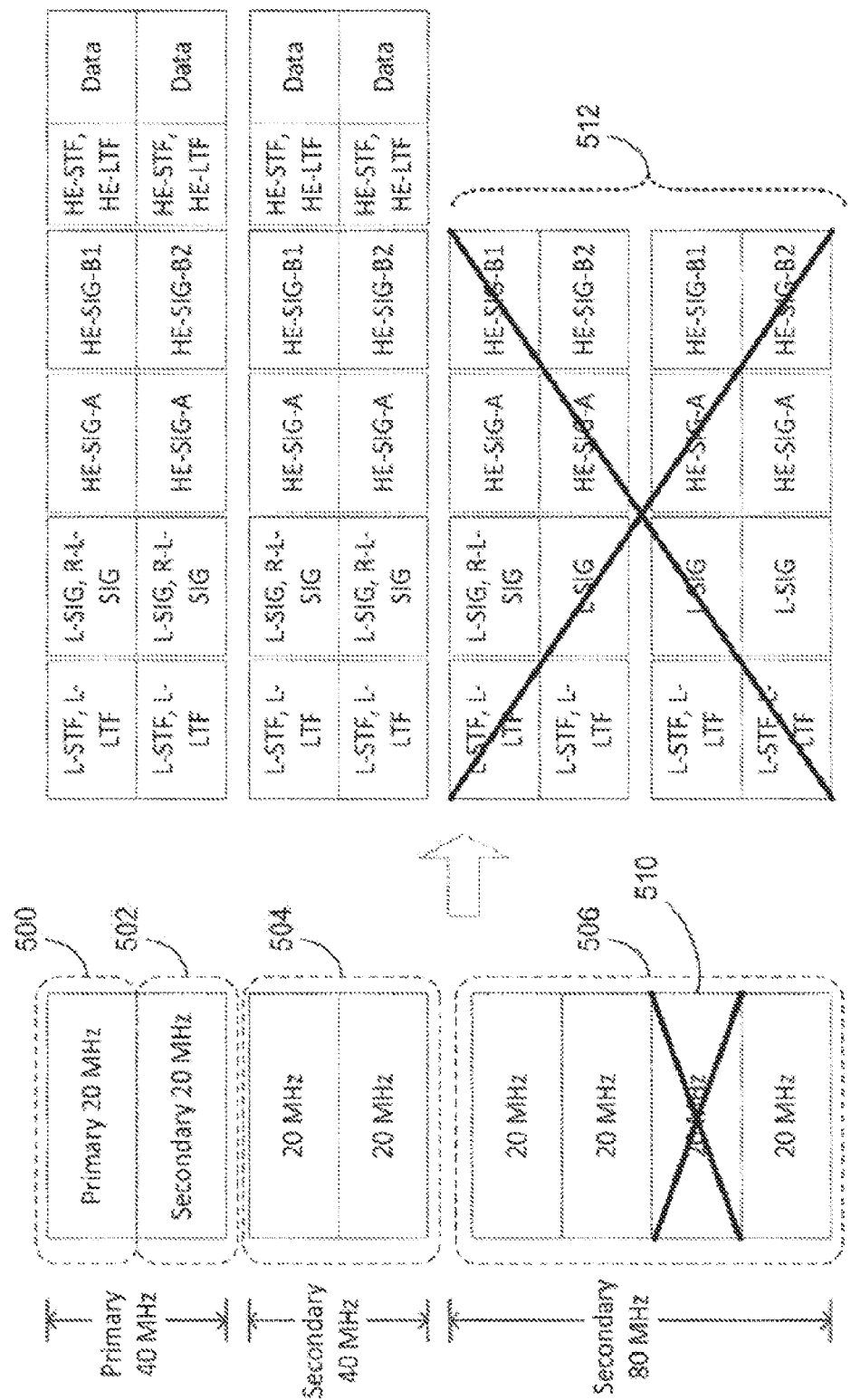
FIGS. 5A-5C depict illustrative schematic diagrams of non-contiguous channel bonding with a frequency band of 160 MHz, in accordance with one or more example embodiments of the present disclosure.
Figure 5B:
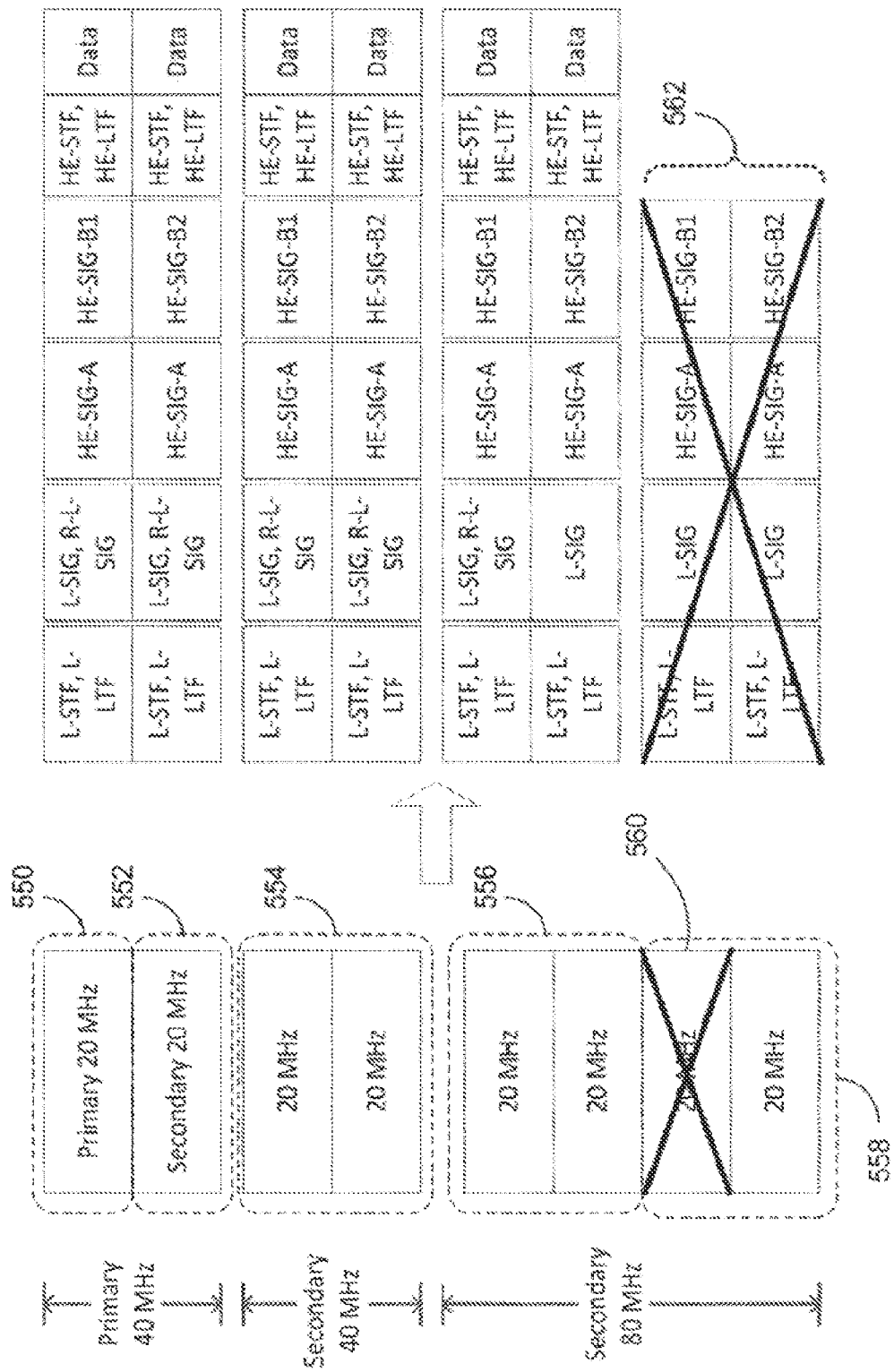
Figure 5C:
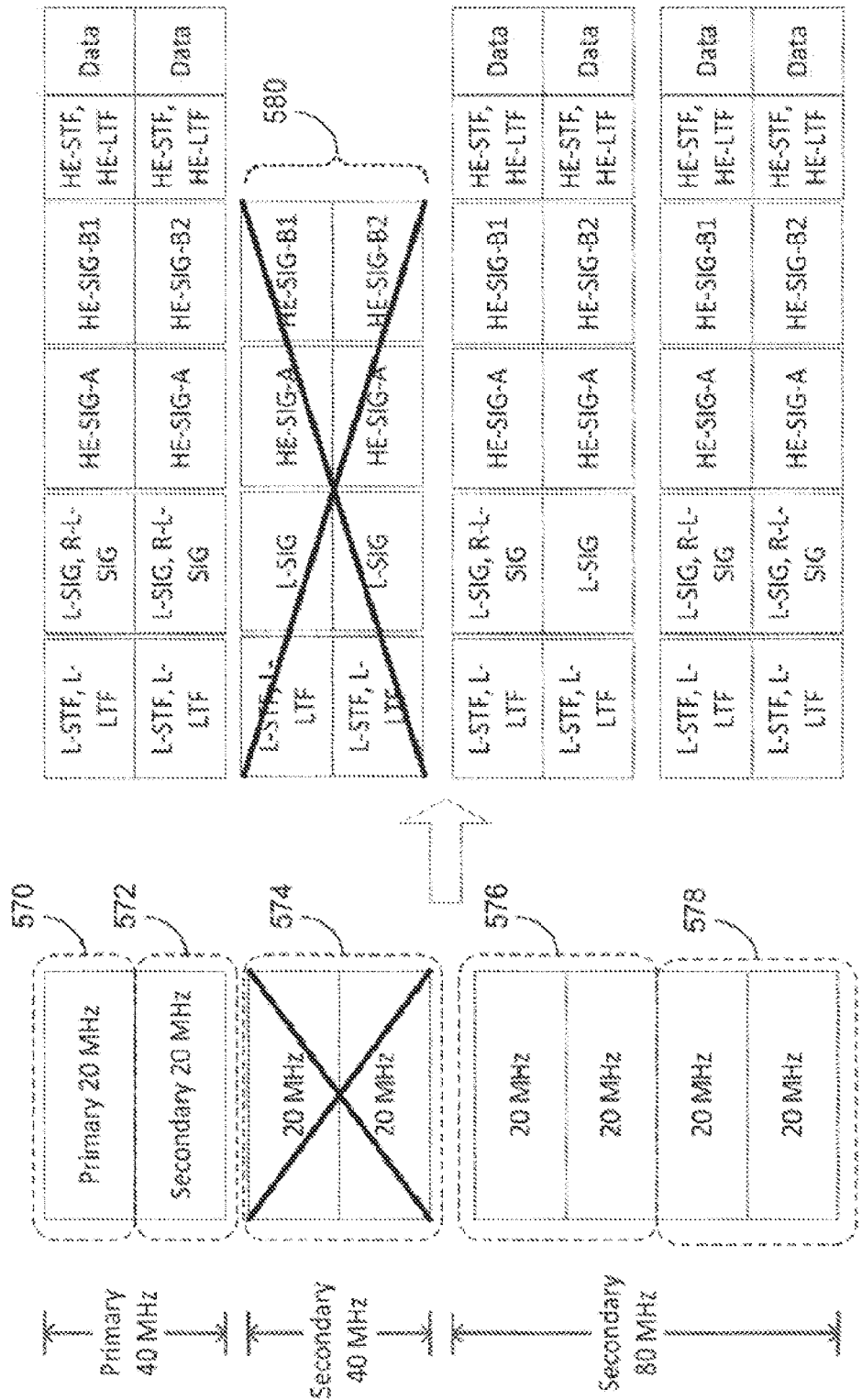

FIGS. 5A-5C depict illustrative schematic diagrams of non-contiguous channel bonding with a frequency band of 160 MHz, in accordance with one or more example embodiments of the present disclosure.

Referring to FIG. 5A, there is shown a 160 MHz channel that is comprised of a primary 20 MHz subchannel 500, a secondary 20 MHz subchannel 502, a secondary 40 MHz subchannel 504 (comprised of two 20 MHz subchannels), and a secondary 80 MHz subchannel 506. FIG. 5A, shows the legacy operation for CCA measurements, where CCA measurements are applied on the primary 20 MHz subchannel 500, the secondary 20 MHz subchannel 502, the secondary 40 MHz subchannel 504, and the secondary 80 MHz subchannel 506. In this example, the secondary 20 MHz subchannel 510 of the secondary 80 MHz subchannel 506 is assumed to be occupied or unavailable, as shown by the crossed off subchannel 510. In this case, the entirety of the secondary 80 MHz subchannel 506 may be unusable due to the contiguous requirement in the legacy systems. Therefore, the legacy and high efficiency preambles 512 may not be sent over the entire secondary 80 MHz subchannel 506 as shown by the crossed off preambles 512.

Referring to FIG. 5B, there is shown a 160 MHz channel that is comprised of a primary 20 MHz subchannel 550, a secondary 20 MHz subchannel 552, a secondary 40 MHz subchannel 554, and a secondary 80 MHz subchannel. The secondary 80 MHz subchannel may be comprised of a first secondary 40 MHz subchannel 556 and a second secondary 40 MHz subchannel 558.

In one embodiment, a non-contiguous channel bonding system may increase throughput gain by utilizing one or more additional CCA measurements on additional subchannels. As depicted in FIG. 5A, the CCA measurements are applied on the primary 20 MHz subchannel 500, the secondary 20 MHz subchannel 502, the secondary 40 MHz subchannel 504, and the secondary 80 MHz subchannel 506. The additional CCA measurement may allow the first secondary 40 MHz subchannel 556 to be used to transmit the legacy and the high efficiency preambles. Therefore, the legacy and high efficiency preambles 562 may not be sent over the second secondary 40 MHz subchannel 558 as shown by the crossed off preambles 562.

Referring to FIG. 5C, there is shown a 160 MHz channel that is comprised of a primary 20 MHz subchannel 570, a secondary 20 MHz subchannel 572, a secondary 40 MHz subchannel 574, and a secondary 80 MHz subchannel. The secondary 80 MHz subchannel may be comprised of a first secondary 40 MHz subchannel 576 and a second secondary 40 MHz subchannel 578.

In one embodiment, a non-contiguous channel bonding system may facilitate channel bonding when a secondary 40 MHz subchannel is punctured or unavailable. For example, a device (e.g., user device 120 FIG. 1) may still be able to use additional subchannels (e.g., secondary 80 MHz subchannel) in the 160 MHz channel even though the secondary 40 MHz subchannel is punctured or unavailable. In other words, the primary 40 MHz subchannel and the secondary 80 MHz subchannel may be utilized by a user device in order to transmit its frames.

In one embodiment, CCA measurements may be performed on the primary 20 MHz subchannel 570, the secondary 20 MHz subchannel 572, the secondary 40 MHz subchannel 574, and the entire secondary 80 MHz subchannel or may be performed on the first secondary 40 MHz subchannel 576 and the second secondary 40 MHz subchannel 578. In this example, since secondary 40 MHz subchannel 574 is punctured or unavailable, the legacy and high efficiency preambles 580 may not be sent over the secondary 40 MHz subchannel 578 as shown by the crossed off preamble 580. It is understood that the above descriptions are for purposes of illustration and are not meant to be limiting.

Figure 6A:
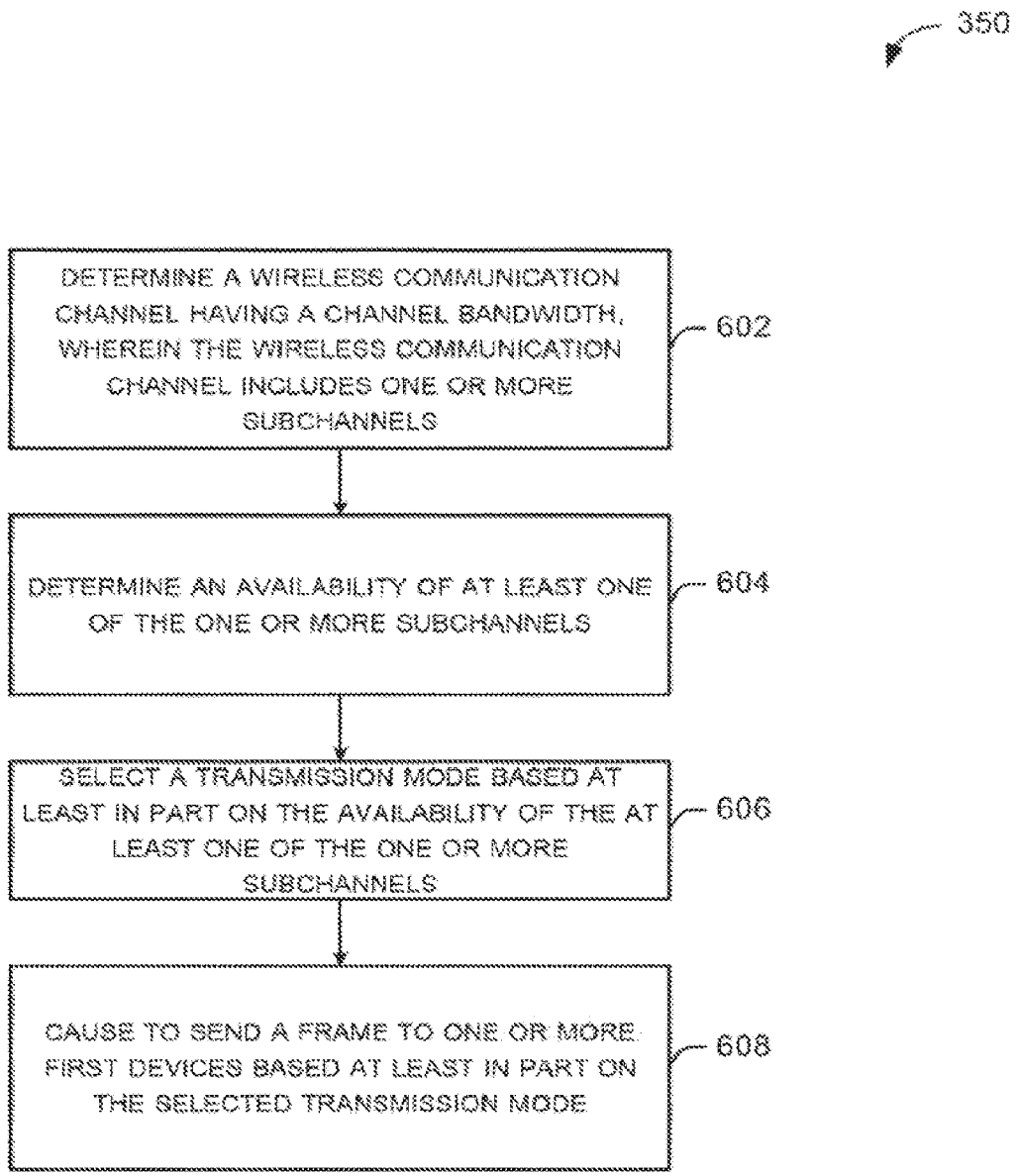
FIG. 6A depicts a flow diagram of an illustrative process for an illustrative non-contiguous channel bonding system, in accordance with one or more example embodiments of the present disclosure.

FIG. 6A illustrates a flow diagram of illustrative process 600 for a non-contiguous channel bonding system in accordance with one or more embodiments of the disclosure.

At block 602, a device (e.g., the user device(s) 120 and/or the AP 102 of FIG. 1) may determine a wireless communication channel having one or more subchannels in accordance with one or more communication standards. During communication between, for example, an AP and one or more user devices, a wireless communication channel may be established between the AP and the one or more user devices. The one or more user devices may include legacy devices and/or HEW devices. In the case where the legacy device and the HEW device coexist, the legacy device may support and may use a 20 MHz band or 40 MHz band to communicate with the AP. Since HEW may support, for example, 80 MHz, one of the 20 MHz subchannels of the 80 MHz band may be used by the legacy device causing a puncturing of the 80 MHz. That is, at least one of the subchannels of the 80 MHz band may be unavailable.

At block 604, the device may determine the availability of at least one of the one or more subchannels. For example, CCA measurement may be utilized by a device in order to determine whether the channel is clear based on a dBm level of reception. FFT circuitry may be utilized to perform the CCA measurement, which may require additional power consumption. When the FFT circuitry is off, the power measurement for each 20 MHz subchannel may need to be done in time domain samples in order to save power. For example, the receiving device may need to down-convert each 20 MHz subchannel to baseband around direct current (DC) and conduct low pass filtering. However, that also may consume power.

At block 606, the device may select a transmission mode based at least in part on the availability of the at least one of the one or more subchannels. The transmission modes may include at least in part, contiguous and non-contiguous modes. That is, based at least in part on the number of the one or more subchannels, a contiguous mode may have no puncturing (e.g., not busy) within the one or more subchannels. In contrast, a non-contiguous mode may include at least one subchannel that may be punctured or busy or unavailable. A device may determine whether a subchannel is punctured or busy or unavailable by performing CCA measurements. In one example, a trigger based and a non-trigger based CCA operations may be utilized in order to allow a device to determine how many CCA measurements to perform. In the trigger-based case, a user device may receive a trigger frame from an AP. After receiving the trigger frame, the user device may conduct CCA measurements within a predetermined time in accordance with and IEEE 802.11 standard. For example, receiving the trigger frame may indicate to the user device that CCA measurements may be performed. In another embodiment, the trigger frame may contain information that may be decoded by the user device receiving the trigger frame to determine how many CCA measurements to be performed. The information may indicate to the user device that CCA measurement should be performed, for example, for each 20 MHz subchannel after receiving the trigger frame within the predetermined time (e.g., 4 microseconds). The trigger frame may be a multiuser, multicast trigger a single user, or unicast frame such as a request to send (RTS) frame. Since FFT is only used for a limited duration in order to conserve power, CCA measurement may be done for each 20 MHz subchannel. For example, a user device may need to continue the FFT operation for one symbol after the trigger frame.

If the communication between the AP and the one or more user devices is configured to operate on a wireless communication channel of 160 MHz, the one or more user devices may be instructed to measure the CCA of the primary 20 MHz, the secondary 20 MHz, the secondary 40 MHz, and the secondary 80 MHz. This may allow a limited number of CCA measurements resulting in lower power consumption as opposed to having to measure the CCA for each of the subchannels in the 160 MHz channel.

If the communication between the AP and the one or more user devices is configured to operate in an 80 MHz channel, the one or more user devices may be instructed to measure the CCA of the primary 20 MHz, the secondary 20 MHz, and the secondary 40 MHz, for a total of 3 CCA measurements. This again may provide an unlimited number of CCA measurements resulting in lower power consumption.

A user device may be instructed to perform one or more CCA measurements in addition to the above measurements. For example, if only one additional CCA measurement is requested, a device may measure the CCA of half of the largest secondary subchannel. For example, if the maximum bandwidth of the system is 80 MHz, then the largest secondary subchannel is the secondary 40 MHz subchannel. This results in 4 CCA measurements in the 80 MHz channel. The extra CCA measurement may determine which, if any, of the individual 20 MHz subchannels in the secondary 40 MHz subchannel are busy or available. This essentially allows the device to perform CCA measurements for each of the 20 MHz subchannels in the 80 MHz channel.

At block 608, the device may cause to send a frame to one or more user devices, wherein the frame is sent on at least one available subchannel of the one or more subchannels. For example, in the case of a wireless communication channel of 80 MHz, if the secondary 20 MHz is busy but the rest of the wireless medication channel is available, the AP may send its frames on any or all of the available subchannels (e.g., the primary 20 MHz subchannel, the secondary 40 MHz subchannel, etc.). It is understood that the above descriptions are for purposes of illustration and are not meant to be limiting.

Figure 6B:
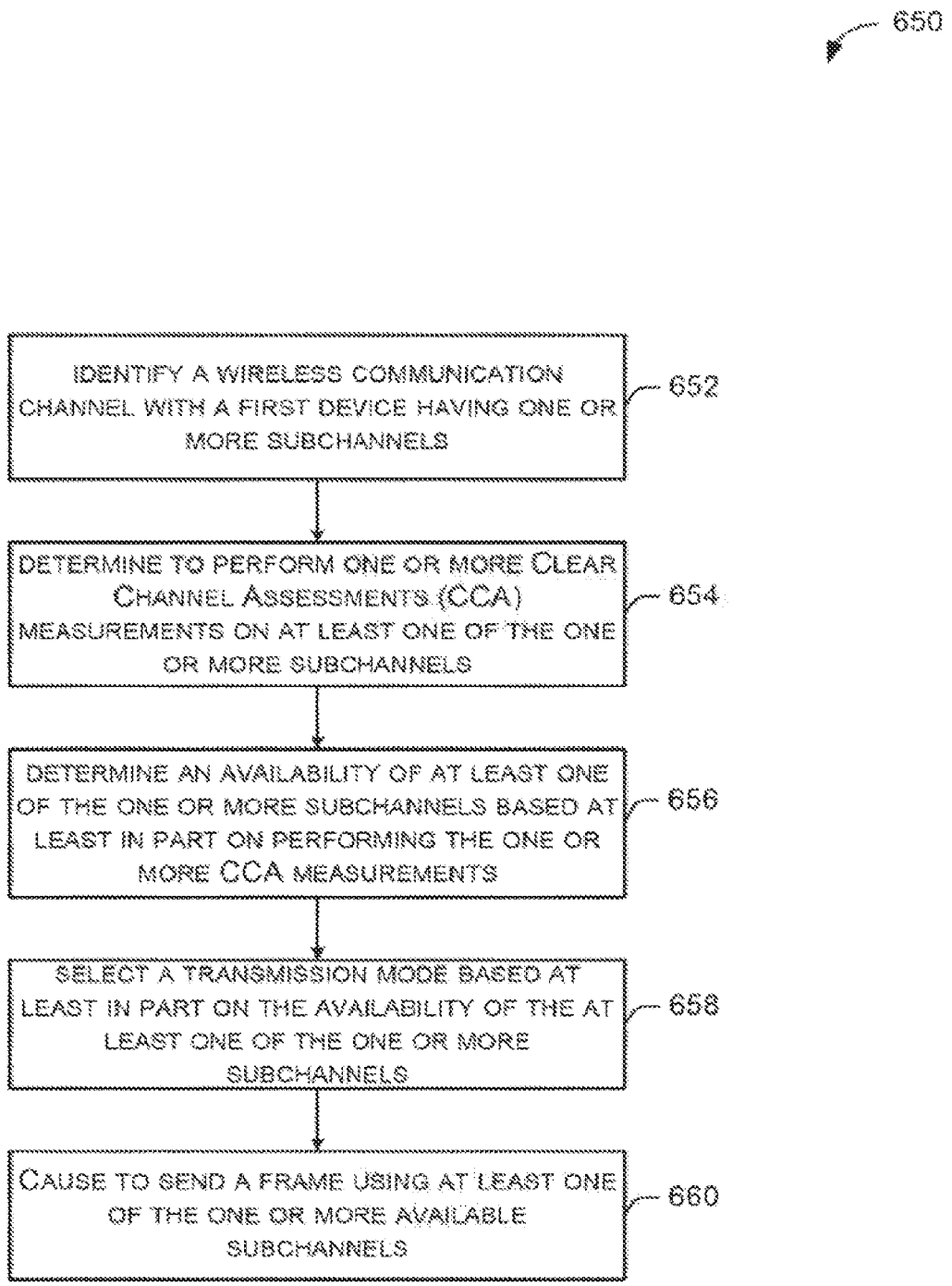
FIG. 6B illustrates a flow diagram of an illustrative process for a high efficiency signal field coding system, in accordance with one or more example embodiments of the present disclosure.

FIG. 6B illustrates a flow diagram of illustrative process 650 for a high efficiency signal field coding system, in accordance with one or more example embodiments of the present disclosure.

At block 652, a device (e.g., the user device(s) 120 and/or the AP 102 of FIG. 1) may identify a wireless communication channel with another device having one or more subchannels. For example, a user device may establish a wireless communication channel with an AP. The wireless communication channel may be configured to be operational on various frequency bands. For example, the AP and the user device may establish a wireless communication channel of 20 MHz, 40 MHz, 80 MHz, 160 MHz, etc. The wireless communication channel may contain one or more subchannels, for example, an 80 MHz wireless communication channel may contain a primary 20 MHz subchannel, a secondary 20 MHz subchannel, and a secondary 40 MHz subchannel. The secondary 40 MHz subchannel may be divided into two 20 MHz subchannels.

At block 654, the device may determine to perform one or more clear channel assessments (CCA) measurements on at least one of the one or more subchannels. A trigger based and a non-trigger based CCA operations may be utilized in order to allow a device to determine how many CCA measurements to perform. In the trigger-based case, a user device may receive a trigger frame from an AP. In one embodiment, a user device may determine how many CCA measurements to perform based at least in part, the IEEE 802.11 standard. In another embodiment, the user device may determine how many CCA measurements to perform based on a received trigger frame. After receiving the trigger frame, the user device may conduct CCA measurements within a predetermined time in accordance with and IEEE 802.11 standard. For example, receiving the trigger frame may indicate to the user device that CCA measurements may be performed. In another embodiment, the trigger frame may contain information that may be decoded by the user device receiving the trigger frame to determine how many CCA measurements to be performed. The information may indicate to the user device that CCA measurement should be performed, for example, for each 20 MHz subchannel after receiving the trigger frame within the predetermined time (e.g., 4 microseconds). The trigger frame may be a multiuser, multicast trigger a single user, or unicast frame such as a request to send (RTS) frame. Since FFT is only used for a limited duration in order to conserve power, CCA measurement may be done for each 20 MHz subchannel. For example, a user device may need to continue the FFT operation for one symbol after the trigger frame. If the communication between the AP and the one or more user devices is configured to operate on a wireless communication channel of 160 MHz, the one or more user devices may be instructed to measure the CCA of the primary 20 MHz, the secondary 20 MHz, the secondary 40 MHz, and the secondary 80 MHz. This may allow a limited number of CCA measurements resulting in lower power consumption as opposed to having to measure the CCA for each of the subchannels in the 160 MHz channel.

If the communication between the AP and the one or more user devices is configured to operate in an 80 MHz channel, the one or more user devices may be instructed to measure the CCA of the primary 20 MHz, the secondary 20 MHz, and the secondary 40 MHz, for a total of 3 CCA measurements. This again may provide an unlimited number of CCA measurements resulting in lower power consumption.

A user device may be instructed to perform one or more CCA measurements in addition to the above measurements. For example, if only one additional CCA measurement is requested, a device may measure the CCA of half of the largest secondary subchannel. For example, if the maximum bandwidth of the system is 80 MHz, then the largest secondary subchannel is the secondary 40 MHz subchannel. This results in 4 CCA measurements in the 80 MHz channel. The extra CCA measurement may determine which, if any, of the individual 20 MHz subchannels in the secondary 40 MHz subchannel are busy or available. This essentially allows the device to perform CCA measurements for each of the 20 MHz subchannels in the 80 MHz channel.

At block 656, the device may determine one or more available subchannels of the one or more subchannels based at least in part on the one or more CCAs. For example, the user device may be instructed to perform one or more CCAs based on the wireless communication frequency size (e.g., 20 MHz, 40 MHz, 80 MHz, 160 MHz, etc.). The user device may determine, based on the CCA measurements, that a 20 MHz subchannel, for example, is unavailable or busy. In that case, the user device may utilize the available subchannels in order to send its frames.

At block 658, the device may cause to send a frame using at least one of the one or more available subchannels. For example, in the case of a wireless communication channel of 80 MHz, if the secondary 20 MHz is busy but the rest of the wireless medication channel is available, the user device may send its frames on any or all of the available subchannels (e.g., the primary 20 MHz subchannel, the secondary 40 MHz subchannel, etc.). It is understood that the above descriptions are for purposes of illustration and are not meant to be limiting.

FIG. 7 shows a functional diagram of an exemplary communication station 700 in accordance with some embodiments. In one embodiment, FIG. 7 illustrates a functional block diagram of a communication station that may be suitable for use as an AP 102 (FIG. 1) or a user device 120 (FIG. 1) in accordance with some embodiments. The communication station 700 may also be suitable for use as a handheld device, a mobile device, a cellular telephone, a smartphone, a tablet, a netbook, a wireless terminal, a laptop computer, a wearable computer device, a femtocell, a high data rate (HDR) subscriber station, an access point, an access terminal, or other personal communication system (PCS) device.

The communication station 700 may include communications circuitry 702 and a transceiver 710 for transmitting and receiving signals to and from other communication stations using one or more antennas 701. The communications circuitry 702 may include circuitry that can operate the physical layer (PHY) communications and/or media access control (MAC) communications for controlling access to the wireless medium, and/or any other communications layers for transmitting and receiving signals. The communication station 700 may also include processing circuitry 706 and memory 708 arranged to perform the operations described herein. In some embodiments, the communications circuitry 702 and the processing circuitry 706 may be configured to perform operations detailed in FIGS. 1A-1C, 2, 3A-3B, 4A-4B, 5A-5B, and 6A-6B.

In accordance with some embodiments, the communications circuitry 702 may be arranged to contend for a wireless medium and configure frames or packets for communicating over the wireless medium. The communications circuitry 702 may be arranged to transmit and receive signals. The communications circuitry 702 may also include circuitry for modulation/demodulation, upconversion/downconversion, filtering, amplification, etc. In some embodiments, the processing circuitry 706 of the communication station 700 may include one or more processors. In other embodiments, two or more antennas 701 may be coupled to the communications circuitry 702 arranged for sending and receiving signals. The memory 708 may store information for configuring the processing circuitry 706 to perform operations for configuring and transmitting message frames and performing the various operations described herein. The memory 708 may include any type of memory, including non-transitory memory, for storing information in a form readable by a machine (e.g., a computer). For example, the memory 708 may include a computer-readable storage device, read-only memory (ROM), random-access memory (RAM), magnetic disk storage media, optical storage media, flash-memory devices and other storage devices and media.

In some embodiments, the communication station 700 may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), a wearable computer device, or another device that may receive and/or transmit information wirelessly.

In some embodiments, the communication station 700 may include one or more antennas 701. The antennas 701 may include one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, the antennas may be effectively separated for spatial diversity and the different channel characteristics that may result between each of the antennas and the antennas of a transmitting station.

In some embodiments, the communication station 700 may include one or more of a keyboard, a display, a non-volatile memory port, multiple antennas, a graphics processor, an application processor, speakers, and other mobile device elements. The display may be an LCD screen including a touch screen.

Although the communication station 700 is illustrated as having several separate functional elements, two or more of the functional elements may be combined and may be implemented by combinations of software-configured elements, such as processing elements including digital signal processors (DSPs), and/or other hardware elements. For example, some elements may include one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements of the communication station 700 may refer to one or more processes operating on one or more processing elements.

Certain embodiments may be implemented in one or a combination of hardware, firmware, and software. Other embodiments may also be implemented as instructions stored on a computer-readable storage device, which may be read and executed by at least one processor to perform the operations described herein. A computer-readable storage device may include any non-transitory memory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, the communication station 700 may include one or more processors and may be configured with instructions stored on a computer-readable storage device memory.

FIG. 8 illustrates a block diagram of an example of a machine 800 or system upon which any one or more of the techniques (e.g., methodologies) discussed herein may be performed. In other embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environments. The machine 800 may be a personal computer (PC), a tablet PC, a set-top box (STB), a personal digital assistant (PDA), a mobile telephone, a wearable computer device, a web appliance, a network router, a switch or bridge, or any machine capable of executing instructions (sequential or otherwise) that specify actions to be taken by that machine, such as a base station. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), or other computer cluster configurations.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer readable medium containing instructions where the instructions configure the execution units to carry out a specific operation when in operation. The configuring may occur under the direction of the executions units or a loading mechanism. Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

The machine (e.g., computer system) 800 may include a hardware processor 802 (e.g., a central processing unit (CPU), a graphics processing unit (GPU), a hardware processor core, or any combination thereof), a main memory 804 and a static memory 806, some or all of which may communicate with each other via an interlink (e.g., bus) 808. The machine 800 may further include a power management device 832, a graphics display device 810, an alphanumeric input device 812 (e.g., a keyboard), and a user interface (UI) navigation device 814 (e.g., a mouse). In an example, the graphics display device 810, alphanumeric input device 812, and UI navigation device 814 may be a touch screen display. The machine 800 may additionally include a storage device (i.e., drive unit) 816, a signal generation device 818 (e.g., a speaker), a non-contiguous channel bonding device 819, a network interface device/transceiver 820 coupled to antenna(s) 830, and one or more sensors 828, such as a global positioning system (GPS) sensor, a compass, an accelerometer, or other sensor. The machine 800 may include an output controller 834, such as a serial (e.g., universal serial bus (USB), parallel, or other wired or wireless (e.g., infrared (IR), near field communication (NFC), etc.) connection to communicate with or control one or more peripheral devices (e.g., a printer, a card reader, etc.)).

The storage device 816 may include a machine readable medium 822 on which is stored one or more sets of data structures or instructions 824 (e.g., software) embodying or utilized by any one or more of the techniques or functions described herein. The instructions 824 may also reside, completely or at least partially, within the main memory 804, within the static memory 806, or within the hardware processor 802 during execution thereof by the machine 800. In an example, one or any combination of the hardware processor 802, the main memory 804, the static memory 806, or the storage device 816 may constitute machine-readable media.

The non-contiguous channel bonding device 819 may carry out or perform any of the operations and processes (e.g., processes 600 and 650) described and shown above. For example, the non-contiguous channel bonding device 819 may be configured to facilitate a trigger based and a non-trigger based non-contiguous channel bonding. In the trigger-based case, a device may be instructed to conduct CCA within a limited time. For example, a trigger frame may instruct the device to measure the CCA for each 20 MHz subchannel after the trigger frame, within, for example, a few microseconds (e.g., 4 microseconds). Since FFT should be used for a limited time in order to preserve power consumption, CCA measurement may be performed for each 20 MHz subchannel. In the non-trigger based case, the device may monitor the channel without instructions, in order to determine whether the channel is available or not.

The non-contiguous channel bonding device 819 may be configured to instruct a device to measure the CCA of the primary 20 MHz, the secondary 20 MHz, the secondary 40 MHz, and the secondary 80 MHz, if the communication between devices (e.g., between an AP and a user device) is configured to operate on a 160 MHz channel. This may allow a limited number of CCA measurements resulting in lower power consumption as opposed to having to measure the CCA for each of the subchannels in the 160 MHz channel.

The non-contiguous channel bonding device 819 may be configured to instruct a device to measure the CCA of the primary 20 MHz, the secondary 20 MHz, and the secondary 40 MHz, if the communication between devices is configured to operate in an 80 MHz channel.

The non-contiguous channel bonding device 819 may be configured to instruct a device to perform one or more CCA measurements in addition to the above measurements. For example, if only one additional CCA measurement is requested, a device may measure the CCA of half of the largest secondary subchannel. For example, if the maximum bandwidth of the system is 80 MHz, then the largest secondary subchannel is the secondary 40 MHz subchannel. This results in 4 CCA measurements in the 80 MHz channel. The extra CCA measurement may determine which, if any, of the individual 20 MHz subchannels in the secondary 40 MHz subchannel are busy or available. This essentially allows the device to perform CCA measurements for each of the 20 MHz subchannels in the 80 MHz channel.

The non-contiguous channel bonding device 819 may be configured to facilitate the one additional CCA measurement to be requested for the largest secondary channel (e.g., the secondary 80 MHz subchannel), if the communication between devices is configured to operate in a 160 MHz channel. That is, two CCA measurements will be performed by the device, one for the first 40 MHz in the secondary 80 MHz subchannel and another one for the second 40 MHz in the secondary 80 MHz subchannel. It is understood that the above descriptions are for purposes of illustration and are not meant to be limiting.

While the machine-readable medium 822 is illustrated as a single medium, the term "machine-readable medium" may include a single medium or multiple media (e.g., a centralized or distributed database, and/or associated caches and servers) configured to store the one or more instructions 824.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "machine-readable medium" may include any medium that is capable of storing, encoding, or carrying instructions for execution by the machine 800 and that cause the machine 800 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks.

The instructions 824 may further be transmitted or received over a communications network 826 using a transmission medium via the network interface device/transceiver 820 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver 820 may include one or more physical jacks (e.g., Ethernet, coaxial, or phone jacks) or one or more antennas to connect to the communications network 826. In an example, the network interface device/transceiver 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 800 and includes digital or analog communications signals or other intangible media to facilitate communication of such software. The operations and processes (e.g., processes 600 and 650) described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments. The terms "computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

The term "access point" (AP) as used herein may be a fixed station. An access point may also be referred to as an access node, a base station, or some other similar terminology known in the art. An access terminal may also be called a mobile station, user equipment (UE), a wireless communication device, or some other similar terminology known in the art. Embodiments disclosed herein generally pertain to wireless networks. Some embodiments may relate to wireless networks that operate in accordance with one of the IEEE 802.11 standards.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Some embodiments may be used in conjunction with one way and/or two-way radio communication systems, cellular radio-telephone communication systems, a mobile phone, a cellular telephone, a wireless telephone, a personal communication system (PCS) device, a PDA device which incorporates a wireless communication device, a mobile or portable global positioning system (GPS) device, a device which incorporates a GPS receiver or transceiver or chip, a device which incorporates an RFID element or chip, a multiple input multiple output (MIMO) transceiver or device, a single input multiple output (SIMO) transceiver or device, a multiple input single output (MISO) transceiver or device, a device having one or more internal antennas and/or external antennas, digital video broadcast (DVB) devices or systems, multi-standard radio devices or systems, a wired or wireless handheld device, e.g., a smartphone, a wireless application protocol (WAP) device, or the like.

Some embodiments may be used in conjunction with one or more types of wireless communication signals and/or systems following one or more wireless communication protocols, for example, radio frequency (RF), infrared (IR), frequency-division multiplexing (FDM), orthogonal FDM (OFDM), time-division multiplexing (TDM), time-division multiple access (TDMA), extended TDMA (E-TDMA), general packet radio service (GPRS), extended GPRS, code-division multiple access (CDMA), wideband CDMA (WCDMA), CDMA 2000, single-carrier CDMA, multi-carrier CDMA, multi-carrier modulation (MDM), discrete multi-tone (DMT), Bluetooth®, global positioning system (GPS), Wi-Fi, Wi-Max, ZigBee, ultra-wideband (UWB), global system for mobile communications (GSM), 2G, 2.5G, 3G, 3.5G, 4G, fifth generation (5G) mobile networks, 3GPP, long term evolution (LTE), LTE advanced, enhanced data rates for GSM Evolution (EDGE), or the like. Other embodiments may be used in various other devices, systems, and/or networks.

According to example embodiments of the disclosure, there may be a device. The device may include at least one memory that stores computer-executable instructions; and at least one processor configured to access the at least one memory, wherein the at least one processor is configured to execute the computer-executable instructions to determine a wireless communication channel, wherein the wireless communication channel includes one or more subchannels; determine an availability of at least one of the one or more subchannels; select a transmission mode based at least in part on the availability of the at least one of the one or more subchannels; and cause to send a frame to one or more first devices using the selected transmission mode.

The implementations may include one or more of the following features. The frame may include at least in part a high efficiency signal A (HE-SIG-A) field and a high efficiency signal B (HE-SIG-B) field. The one or more subchannels include at least one of a primary 20 MHz subchannel and one or more secondary 20 MHz subchannels. The transmission mode may include at least one of a contiguous or a non-contiguous mode. The at least one processor may be further configured to execute the computer-executable instructions to perform a Clear Channel assessment (CCA) measurement on half of the largest secondary subchannel of the one or more subchannels. The instructions to determine the availability of the at least one of the one or more subchannels may further include the instructions to perform Clear Channel assessment (CCA) measurements on the one or more subchannels. The CCA measurements are to be performed at least in part on a primary 20 MHz, a secondary 20 MHz, a secondary 40 MHz, and a secondary 80 MHz when a size of the wireless communication channel is 160 MHz. The CCA measurements are to be performed at least in part on a primary 20 MHz, a secondary 20 MHz, and a secondary 40 MHz when a size of the wireless communication channel is 80 MHz. The device may further include a transceiver configured to transmit and receive wireless signals. The device of claim 9, further comprising one or more antennas coupled to the transceiver.

According to example embodiments of the disclosure, there may be a non-transitory computer-readable medium storing computer-executable instructions which, when executed by a processor, cause the processor to perform operations. The operations may include identifying a wireless communication channel with a first device having one or more subchannels; determining to perform one or more Clear Channel Assessments (CCA) measurements on at least one of the one or more subchannels; determining an availability of at least one of the one or more subchannels based at least in part on performing the one or more CCA measurements; selecting a transmission mode based at least in part on the availability of the at least one of the one or more subchannels; and causing to send a frame to the first device based at least in part on the availability of at least one of the one or more subchannels.

The implementations may include one or more of the following features. The computer-executable instructions cause the processor to further perform operations comprising: identifying a trigger frame from the first device; and extracting information associated with from the trigger frame. The information may include a time to perform the one or more CCA measurements. The computer-executable instructions cause the processor to further perform operations comprising: determining a channel bandwidth of the wireless communication channel; and determining to perform a number of CCA measurements of the one or more CCA measurements based at least in part on the channel bandwidth of the wireless communication channel. The one or more subchannels include at least one of a primary 20 MHz subchannel and one or more secondary 20 MHz subchannels.

According to example embodiments of the disclosure, there may include a method. The method may include determining a wireless communication channel having a channel bandwidth, wherein the wireless communication channel includes one or more subchannels; determining an availability of at least one of the one or more subchannels; selecting a transmission mode based at least in part on the availability of the at least one of the one or more subchannels; and causing to send a frame to one or more first devices based at least in part on the selected transmission mode.

The implementations may include one or more of the following features. The frame includes at least in part a high efficiency signal A (HE-SIG-A) field and a high efficiency signal B (HE-SIG-B) field. The one or more subchannels include at least one of a primary 20 MHz subchannel and one or more secondary 20 MHz subchannels. The transmission mode include at least one of a contiguous or a non-contiguous mode. The method may further include performing a Clear Channel assessment (CCA) measurement on half of the largest secondary subchannel of the one or more subchannels. The determining the availability of the at least one of the one or more subchannels may further include performing Clear Channel assessment (CCA) measurements on the one or more subchannels. The CCA measurements are to be performed at least in part on a primary 20 MHz, a secondary 20 MHz, a secondary 40 MHz, and a secondary 80 MHz when a size of the wireless communication channel is 160 MHz. The CCA measurements are to be performed at least in part on a primary 20 MHz, a secondary 20 MHz, and a secondary 40 MHz when a size of the wireless communication channel is 80 MHz.

In example embodiments of the disclosure, there may be an apparatus. The apparatus may include means for determining a wireless communication channel having a channel bandwidth, wherein the wireless communication channel includes one or more subchannels. The apparatus may include means for determining an availability of at least one of the one or more subchannels. The apparatus may include means for selecting a transmission mode based at least in part on the availability of the at least one of the one or more subchannels. The apparatus may include means for causing to send a frame to one or more first devices based at least in part on the selected transmission mode.

The implementations may include one or more of the following features. The frame includes at least in part a high efficiency signal A (HE-SIG-A) field and a high efficiency signal B (HE-SIG-B) field. The one or more subchannels include at least one of a primary 20 MHz subchannel and one or more secondary 20 MHz subchannels. The transmission mode include at least one of a contiguous or a non-contiguous mode. The apparatus may further include means for performing a Clear Channel assessment (CCA) measurement on half of the largest secondary subchannel of the one or more subchannels. The means for determining the availability of the at least one of the one or more subchannels further includes means for performing Clear Channel assessment (CCA) measurements on the one or more subchannels. The CCA measurements are to be performed at least in part on a primary 20 MHz, a secondary 20 MHz, a secondary 40 MHz, and a secondary 80 MHz when a size of the wireless communication channel is 160 MHz. The CCA measurements are to be performed at least in part on a primary 20 MHz, a secondary 20 MHz, and a secondary 40 MHz when a size of the wireless communication channel is 80 MHz.

Certain aspects of the disclosure are described above with reference to block and flow diagrams of systems, methods, apparatuses, and/or computer program products according to various implementations. It will be understood that one or more blocks of the block diagrams and flow diagrams, and combinations of blocks in the block diagrams and the flow diagrams, respectively, may be implemented by computer-executable program instructions. Likewise, some blocks of the block diagrams and flow diagrams may not necessarily need to be performed in the order presented, or may not necessarily need to be performed at all, according to some implementations.

These computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that may direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. An apparatus for a station device, the apparatus comprising processing circuitry coupled to storage, the processing circuitry configured to: encode a high efficiency (HE) frame for transmission to one or more EHT stations (STAs), wherein the HE frame is transmitted on a channel comprising at least one of:
    a first 80 MHz channel bandwidth, where a first secondary 20 MHz subchannel is punctured while a first secondary 40 MHz subchannel is idle,
    a second 80 MHz channel bandwidth, where a first 20 MHz subchannel of a second secondary 40 MHz subchannel is punctured while a second 20 MHz subchannel of the second secondary 40 MHz subchannel and a third 20 MHz subchannel are idle,
    a first 160 MHz channel bandwidth or a first 80+80 MHz channel bandwidth, where in a first primary 80 MHz subchannel, a fourth secondary 20 MHz subchannel is punctured while a third secondary 40 MHz subchannel and at least one of four 20 MHz subchannels in a first secondary 80 MHz channel are idle, and
    a second 160 MHz channel bandwidth or a second 80+80 MHz channel bandwidth, where in a second primary 80 MHz subchannel, a primary 40 MHz is present while a fourth secondary 20 MHz channel and at least one of four 20 MHz subchannels in a second secondary 80 MHz channel are idle;
    perform a Clear Channel Assessment (CCA) measurement on primary 20MHz subchannel, secondary 20 MHz subchannel, or the secondary 40 MHz subchannel for the 80 MHz channel bandwidth, and on primary 20 MHz subchannel, secondary 20MHz subchannel, secondary 40 MHz subchannel, or the secondary 80 MHz subchannel for the 160 MHz channel bandwidth; and
    cause to send the HE frame on at least a primary subchannel and a secondary subchannel even though at least one or more subchannels are punctured.

2. The apparatus of claim 1, wherein the HE frame includes one or more fields that comprise at least a high efficiency signal A (HE-SIG-A) field and a high efficiency signal B (HE-SIG-B) field.

3. The apparatus of claim 1, wherein the processing circuitry is further configured to perform a clear channel assessment (CCA) determination of at least one of a primary subchannel and secondary subchannels, based on a first time interval indicated in a trigger frame received from an access point.

4. The apparatus of claim 3, wherein the processing circuitry is further configured to determine a secondary 20 MHz subchannel of the channel is punctured based on a CCA determination performed during the first time interval.

5. The apparatus of claim 3, wherein the processing circuitry is further configured to determine a secondary 20 MHz subchannel of the channel is idle based on a CCA determination performed during the first time interval.

6. The apparatus of claim 1, wherein the processing circuitry is further configured to determine an indication associated with a clear channel assessment (CCA) status of each subchannel of the channel including a primary subchannel and a secondary subchannel of the channel.

7. The apparatus of claim 1, wherein the processing circuitry is further configured to determine an indication to perform CCA on at least one of subchannels of the channel, based on a trigger frame received from an access point.

8. The apparatus of claim 1, wherein the processing circuitry is further configured to:
  determine a primary channel of the channel is busy;
  determine a secondary channel of the channel is idle; and
  use at least the secondary channel to send the HE frame.

9. A non-transitory computer-readable medium storing computer-executable instructions which when executed by one or more processors result in performing operations comprising:
  encoding a high efficiency (HE) frame for transmission to one or more EHT stations (STAs), wherein the HE frame is transmitted on a channel comprising at least one of:
  a first 80 MHz channel bandwidth, where a first secondary 20 MHz subchannel is punctured while a first secondary 40 MHz subchannel is idle,
  a second 80 MHz channel bandwidth, where a first 20 MHz subchannel of a second secondary 40 MHz subchannel is punctured while a second 20 MHz subchannel of the second secondary 40 MHz subchannel and a third 20 MHz subchannel are idle,
  a first 160 MHz channel bandwidth or a first 80+80 MHz channel bandwidth, where in a first primary 80 MHz subchannel, a fourth secondary 20 MHz subchannel is punctured while a third secondary 40 MHz subchannel and at least one of four 20 MHz subchannels in a first secondary 80 MHz channel are idle, and
  a second 160 MHz channel bandwidth or a second 80+80 MHz channel bandwidth, where in a second primary 80 MHz subchannel, a primary 40 MHz is present while a fourth secondary 20 MHz channel and at least one of four 20 MHz subchannels in a second secondary 80 MHz channel are idle;
  performing a Clear Channel Assessment (CCA) measurement on primary 20MHz subchannel, secondary 20 MHz subchannel, or the secondary 40 MHz subchannel for the 80 MHz channel bandwidth, and on primary 20 MHz subchannel, secondary 20MHz subchannel, secondary 40 MHz subchannel, or the secondary 80 MHz subchannel for the 160 MHz channel bandwidth; and
  causing to send the HE frame on at least a primary subchannel and a secondary subchannel even though at least one or more subchannels are punctured.

10. The non-transitory computer-readable medium of claim 9, wherein the HE frame includes one or more fields that comprise at least a high efficiency signal A (HE-SIG-A) field and a high efficiency signal B (HE-SIG-B) field.

11. The non-transitory computer-readable medium of claim 9, wherein the operations further comprise performing a clear channel assessment (CCA) determination of at least one of a primary subchannel and secondary subchannels, based on a first time interval indicated in a trigger frame received from an access point.

12. The non-transitory computer-readable medium of claim 11, wherein the operations further comprise determining a secondary 20 MHz subchannel of the channel is punctured based on a CCA determination performed during the first time interval.

13. The non-transitory computer-readable medium of claim 11, wherein the operations further comprise determining a secondary 20 MHz subchannel of the channel is idle based on a CCA determination performed during the first time interval.

14. The non-transitory computer-readable medium of claim 9, wherein the operations further comprise determining an indication associated with a clear channel assessment (CCA) status of each subchannel of the channel including a primary subchannel and a secondary subchannel of the channel.

15. The non-transitory computer-readable medium of claim 9, wherein the operations further comprise determining an indication to perform CCA on at least one of subchannels of the channel, based on a trigger frame received from an access point.

16. The non-transitory computer-readable medium of claim 9, wherein the operations further comprise:
  determining a primary channel of the channel is busy;
  determining a secondary channel of the channel is idle; and
  using at least the secondary channel to send the HE frame.

17. A method comprising: encoding a high efficiency (HE) frame for transmission to one or more EHT stations (STAs), wherein the HE frame is transmitted on a channel comprising at least one of:
  a first 80 MHz channel bandwidth, where a first secondary 20 MHz subchannel is punctured while a first secondary 40 MHz subchannel is idle,
  a second 80 MHz channel bandwidth, where a first 20 MHz subchannel of a second secondary 40 MHz subchannel is punctured while a second 20 MHz subchannel of the second secondary 40 MHz subchannel and a third 20 MHz subchannel are idle,
  a first 160 MHz channel bandwidth or a first 80+80 MHz channel bandwidth, where in a first primary 80 MHz subchannel, a fourth secondary 20 MHz subchannel is punctured while a third secondary 40 MHz subchannel and at least one of four 20 MHz subchannels in a first secondary 80 MHz channel are idle, and
  a second 160 MHz channel bandwidth or a second 80+80 MHz channel bandwidth, where in a second primary 80 MHz subchannel, a primary 40 MHz is present while a fourth secondary 20 MHz channel and at least one of four 20 MHz subchannels in a second secondary 80 MHz channel are idle;
  performing a Clear Channel Assessment (CCA) measurement on primary 20MHz subchannel, secondary 20 MHz subchannel, or the secondary 40 MHz subchannel for the 80 MHz channel bandwidth, and on primary 20 MHz subchannel, secondary 20MHz subchannel, secondary 40 MHz subchannel, or the secondary 80 MHz subchannel for the 160 MHz channel bandwidth; and
  causing to send the HE frame on at least a primary subchannel and a secondary subchannel even though at least one or more subchannels are punctured.

18. The method of claim 17, wherein the HE frame includes one or more fields that comprise at least a high efficiency signal A (HE-SIG-A) field and a high efficiency signal B (HE-SIG-B) field.

19. The method of claim 17, further comprising performing a clear channel assessment (CCA) determination of at least one of a primary subchannel and secondary subchannels, based on a first time interval indicated in a trigger frame received from an access point.

20. The method of claim 19, further comprising determining a secondary 20MHz subchannel of the channel is punctured based on a CCA determination performed during the first time interval.

* * * * *